(12) United States Patent
Yamazaki et al.

(10) Patent No.: US 9,978,776 B2
(45) Date of Patent: May 22, 2018

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Kengo Akimoto, Atsugi (JP); Atsushi Umezaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 15/090,925

(22) Filed: Apr. 5, 2016

(65) Prior Publication Data

US 2016/0218120 A1 Jul. 28, 2016

Related U.S. Application Data

(63) Continuation of application No. 12/568,120, filed on Sep. 28, 2009, now Pat. No. 9,324,874.

(30) Foreign Application Priority Data

Oct. 3, 2008 (JP) .................................. 2008-259031

(51) Int. Cl.
*H01L 29/786* (2006.01)
*H01L 27/12* (2006.01)
(Continued)

(52) U.S. Cl.
CPC ........ *H01L 27/1225* (2013.01); *H01L 27/124* (2013.01); *H01L 29/24* (2013.01);
(Continued)

(58) Field of Classification Search
CPC ... H01L 27/1225; H01L 27/124; H01L 29/24; H01L 29/42356; H01L 29/78606; H01L 29/7869
(Continued)

(56) References Cited

U.S. PATENT DOCUMENTS 5,184,007 A    2/1993  Saika et al.
5,338,959 A    8/1994  Kim et al.
(Continued)

FOREIGN PATENT DOCUMENTS

CN    001333475 A    1/2002
CN    001941299 A    4/2007
(Continued)

OTHER PUBLICATIONS

Search Report (Application No. 09170486.6) dated Mar. 3, 2010.
(Continued)

*Primary Examiner* — Ori Nadav
(74) *Attorney, Agent, or Firm* — Robinson Intellectual Property Law Office; Eric J. Robinson

(57) ABSTRACT

A pixel portion and a driver circuit driving the pixel portion are formed over the same substrate. At least a part of the driver circuit is formed using an inverted staggered thin film transistor in which an oxide semiconductor layer is used and a channel protective layer is provided over the oxide semiconductor layer serving as a channel formation region which is overlapped with the gate electrode. The driver circuit as well as the pixel portion is provided over the same substrate to reduce manufacturing costs.

12 Claims, 30 Drawing Sheets

(51) Int. Cl.
*H01L 29/24* (2006.01)
*H01L 29/423* (2006.01)

(52) U.S. Cl.
CPC .... *H01L 29/42356* (2013.01); *H01L 29/7869* (2013.01); *H01L 29/78606* (2013.01)

(58) Field of Classification Search
USPC .......................................................... 257/43
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,811,318 A | 9/1998 | Kweon | |
| 5,847,410 A | 12/1998 | Nakajima | |
| 5,930,607 A | 7/1999 | Satou | |
| 6,285,232 B1 | 9/2001 | Hasegawa | |
| 6,294,274 B1 | 9/2001 | Kawazoe et al. | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,730,538 B1* | 5/2004 | Meek ............... H01L 21/31604 257/E21.274 | |
| 6,762,802 B2 | 7/2004 | Ono et al. | |
| 6,936,188 B1* | 8/2005 | Haga ...................... C30B 25/02 117/2 | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| RE39,211 E | 8/2006 | Kweon | |
| 7,105,868 B2 | 9/2006 | Nause et al. | |
| 7,211,825 B2 | 5/2007 | Shih et al. | |
| 7,218,048 B2 | 5/2007 | Choi et al. | |
| 7,273,773 B2 | 9/2007 | Yamazaki et al. | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,491,987 B2 | 2/2009 | Genrikh et al. | |
| 7,501,293 B2 | 3/2009 | Ito et al. | |
| 7,576,394 B2 | 8/2009 | Furuta et al. | |
| 7,601,984 B2 | 10/2009 | Sano et al. | |
| 7,633,470 B2 | 12/2009 | Kane | |
| 7,674,650 B2 | 3/2010 | Akimoto et al. | |
| 7,687,807 B2 | 3/2010 | Koo et al. | |
| 7,732,819 B2 | 6/2010 | Akimoto et al. | |
| 7,760,309 B2 | 7/2010 | Ahn et al. | |
| 7,768,585 B2 | 8/2010 | Nakamura | |
| 7,791,082 B2 | 9/2010 | Iwasaki | |
| 7,847,287 B2 | 12/2010 | Kim et al. | |
| 7,858,451 B2 | 12/2010 | Maekawa et al. | |
| 7,863,611 B2 | 1/2011 | Abe et al. | |
| 7,910,490 B2 | 3/2011 | Akimoto et al. | |
| 7,910,920 B2 | 3/2011 | Park et al. | |
| 7,932,521 B2 | 4/2011 | Akimoto et al. | |
| 7,939,822 B2 | 5/2011 | Maekawa et al. | |
| 7,940,085 B2 | 5/2011 | Kim et al. | |
| 7,968,382 B2 | 6/2011 | Jinbo et al. | |
| 7,981,734 B2 | 7/2011 | Furuta et al. | |
| 8,003,449 B2 | 8/2011 | Akimoto et al. | |
| 8,072,565 B2 | 12/2011 | Ahn et al. | |
| 8,203,146 B2 | 6/2012 | Abe et al. | |
| 8,207,533 B2 | 6/2012 | Maekawa et al. | |
| 8,217,680 B2 | 7/2012 | Kim et al. | |
| 8,247,814 B2 | 8/2012 | Maekawa et al. | |
| 8,274,077 B2 | 9/2012 | Akimoto et al. | |
| 8,399,313 B2 | 3/2013 | Akimoto et al. | |
| 8,575,618 B2 | 11/2013 | Maekawa et al. | |
| 8,614,442 B2 | 12/2013 | Park et al. | |
| 8,994,060 B2 | 3/2015 | Jinbo et al. | |
| 9,130,049 B2 | 9/2015 | Sano et al. | |
| 9,184,221 B2 | 11/2015 | Jinbo et al. | |
| 9,583,637 B2 | 2/2017 | Sano et al. | |
| 2001/0030323 A1 | 10/2001 | Ikeda | |
| 2001/0046027 A1 | 11/2001 | Tai et al. | |
| 2002/0043662 A1 | 4/2002 | Yamazaki et al. | |
| 2002/0044111 A1 | 4/2002 | Yamazaki et al. | |
| 2002/0056838 A1 | 5/2002 | Ogawa | |
| 2002/0130363 A1 | 9/2002 | Yamazaki et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0051823 A1 | 3/2004 | Choi | |
| 2004/0127038 A1 | 7/2004 | Carcia et al. | |
| 2004/0184027 A1 | 9/2004 | Mizutani et al. | |
| 2004/0232421 A1 | 11/2004 | Ono et al. | |
| 2005/0007507 A1 | 1/2005 | Ono et al. | |
| 2005/0017302 A1 | 1/2005 | Hoffman | |
| 2005/0039670 A1 | 2/2005 | Hosono et al. | |
| 2005/0082968 A1 | 4/2005 | Choi et al. | |
| 2005/0162579 A1 | 7/2005 | Jeong et al. | |
| 2005/0199959 A1 | 9/2005 | Chiang et al. | |
| 2005/0199960 A1 | 9/2005 | Hoffman et al. | |
| 2005/0275038 A1 | 12/2005 | Shih et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292726 A1 | 12/2006 | Akimoto et al. | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0096816 A1 | 5/2007 | Paul et al. | |
| 2007/0108446 A1 | 5/2007 | Akimoto | |
| 2007/0152217 A1 | 7/2007 | Lai et al. | |
| 2007/0159568 A1 | 7/2007 | Ono et al. | |
| 2007/0171157 A1 | 7/2007 | Choi et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0272948 A1 | 11/2007 | Koo et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0042217 A1 | 2/2008 | Jeong et al. | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |

(56) References Cited

U.S. PATENT DOCUMENTS

| | | |
|---|---|---|
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0091678 A1 | 4/2009 | Jeong et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025678 A1 | 2/2010 | Yamazaki et al. |
| 2010/0065844 A1 | 3/2010 | Tokunaga |
| 2010/0084651 A1 | 4/2010 | Yamazaki et al. |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0117079 A1 | 5/2010 | Miyairi et al. |
| 2010/0136743 A1 | 6/2010 | Akimoto et al. |
| 2010/0252826 A1 | 10/2010 | Yamazaki et al. |
| 2010/0301326 A1 | 12/2010 | Miyairi et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2013/0277672 A1 | 10/2013 | Sano et al. |
| 2017/0125605 A1 | 5/2017 | Sano et al. |

FOREIGN PATENT DOCUMENTS

| | | |
|---|---|---|
| CN | 101246909 A | 8/2008 |
| EP | 0782040 A | 7/1997 |
| EP | 1380880 A | 1/2004 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2172972 A | 4/2010 |
| EP | 2226847 A | 9/2010 |
| EP | 2453480 A | 5/2012 |
| EP | 2453481 A | 5/2012 |
| EP | 2455975 A | 5/2012 |
| JP | 58-191461 A | 11/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-301565 A | 12/1988 |
| JP | 02-156676 A | 6/1990 |
| JP | 03-231472 A | 10/1991 |
| JP | 05-251705 A | 9/1993 |
| JP | 06-202156 A | 7/1994 |
| JP | 08-264794 A | 10/1996 |
| JP | 09-189924 A | 7/1997 |
| JP | 10-290012 A | 10/1998 |
| JP | 11-505377 | 5/1999 |
| JP | 2000-044236 A | 2/2000 |
| JP | 2000-150900 A | 5/2000 |
| JP | 2001-053283 A | 2/2001 |
| JP | 2001-250949 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-273228 A | 9/2003 |
| JP | 2003-280034 A | 10/2003 |
| JP | 2003-309266 A | 10/2003 |
| JP | 2004-103957 A | 4/2004 |
| JP | 2004-273614 A | 9/2004 |
| JP | 2004-273732 A | 9/2004 |
| JP | 2004-349583 A | 12/2004 |
| JP | 2005-352479 A | 12/2005 |
| JP | 2006-165529 A | 6/2006 |
| JP | 2006-165532 A | 6/2006 |
| JP | 2006-179878 A | 7/2006 |
| JP | 2006-245557 A | 9/2006 |
| JP | 2007-096055 A | 4/2007 |
| JP | 2007-123861 A | 5/2007 |
| JP | 2007-150158 A | 6/2007 |
| JP | 2007-250983 A | 9/2007 |
| JP | 2007-529119 | 10/2007 |
| JP | 2007-299913 A | 11/2007 |
| JP | 2007-316104 A | 12/2007 |
| JP | 2007-318061 A | 12/2007 |
| JP | 2008-085048 A | 4/2008 |
| JP | 2008-091896 A | 4/2008 |
| JP | 2008-140984 A | 6/2008 |
| JP | 2008-211191 A | 9/2008 |
| JP | 2010-087518 A | 4/2010 |
| KR | 2007-0090182 A | 9/2007 |
| TW | 200514009 | 4/2005 |
| TW | 200802888 | 1/2008 |
| WO | WO 2004/114391 | 12/2004 |
| WO | WO-2005/093850 | 10/2005 |
| WO | WO-2006/051993 | 5/2006 |
| WO | WO-2007/089048 | 8/2007 |
| WO | WO-2007/119386 | 10/2007 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 32, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Letts. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn+O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of SOL-Gel-Derived Zinc Oxide Films by Irradiation With Ultraviolet Lamp", Journal of SOL-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Letts. (Applied Physics Letters), Sep. 13, 2004, vol. 85, No. 11, pp. 1993-1995.
Cho.Y et al., "Characteristics of a-Si:H Dual-Gate TFTs Using ITO Electrode for LCD Driver", AM-FPD '08 Digest of Technical Papers, Jul. 2, 2008, pp. 229-232.
Takahashi.K et al., "4p-N-10 Back-channel control in amorphous In—Ga—Zn—O TFTs", 69th Japan Society of Applied Physics, Sep. 1, 2008, No. 2, p. 851.
Chinese Office Action (Application No. 200910175793.X) dated Mar. 5, 2013.
European Official Communication (Application No. 09170486.6) dated Aug. 27, 2014.
Taiwanese Office Action (Application No. 098132322) dated Apr. 7, 2015.
Chinese Office Action (Application No. 201410186225.0) dated May 4, 2016.
Korean Office Action (Application No. 2017-0128270) dated Dec. 4, 2017.

\* cited by examiner

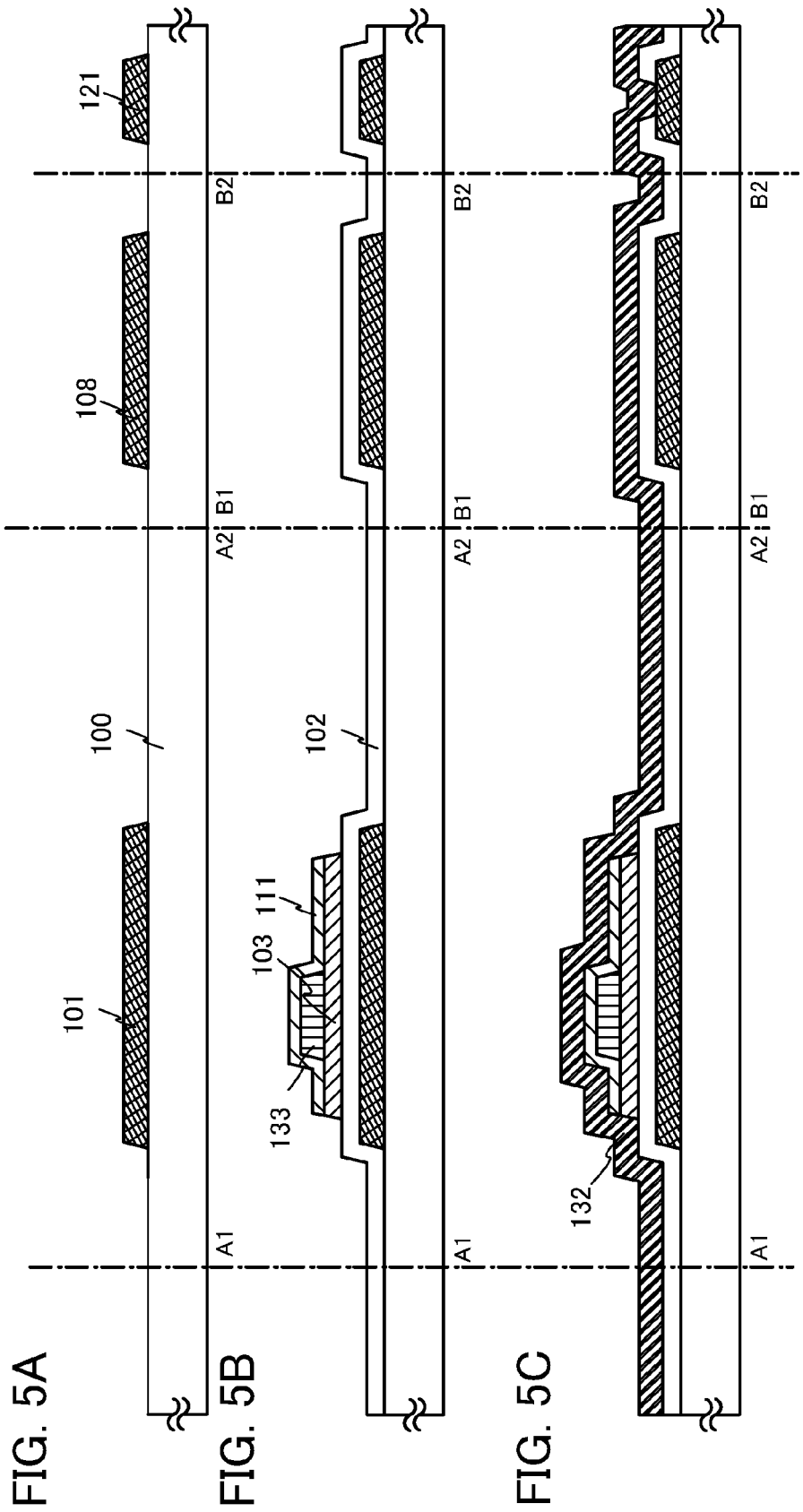

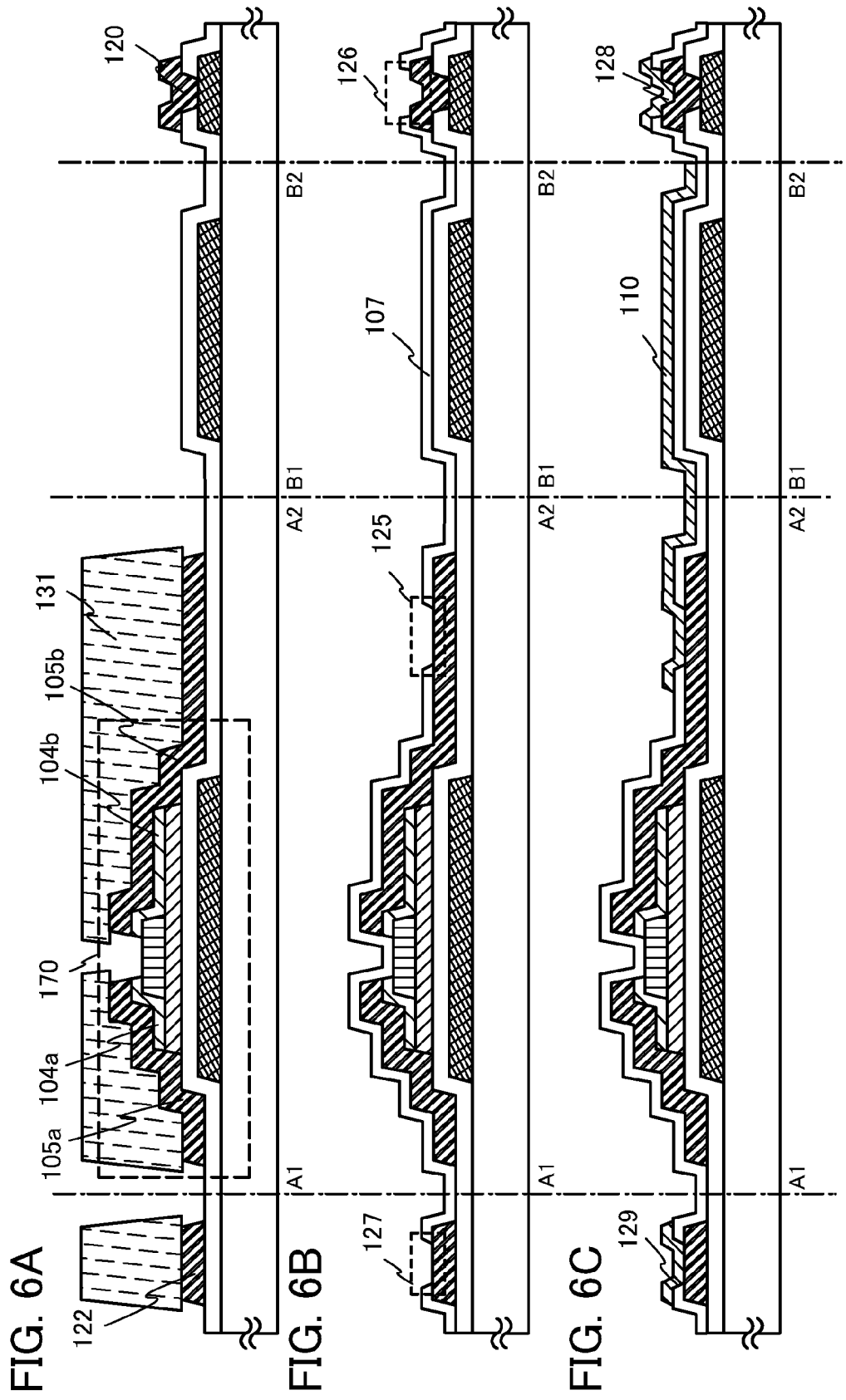

FIG. 11A1 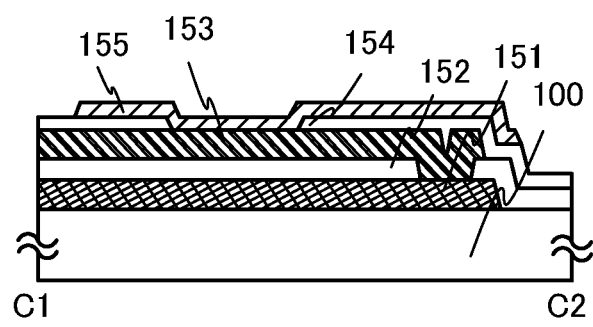
FIG. 11A2 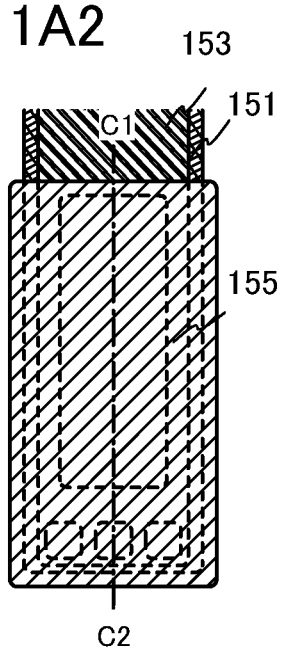
FIG. 11B1 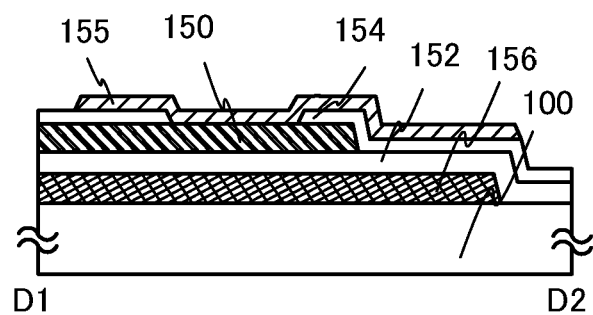
FIG. 11B2 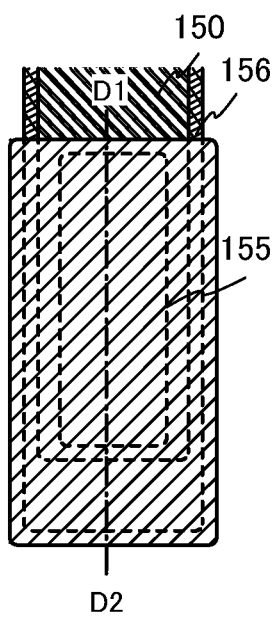

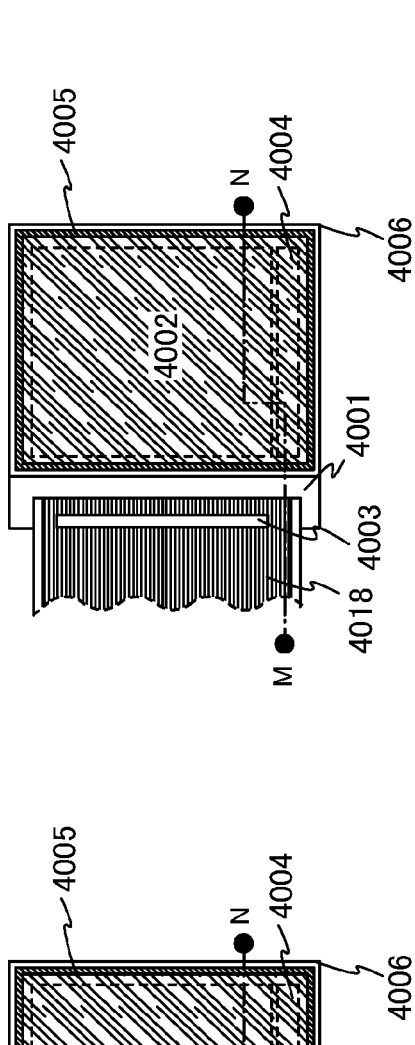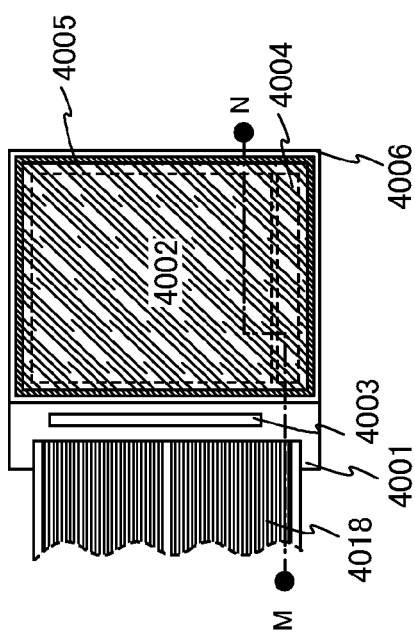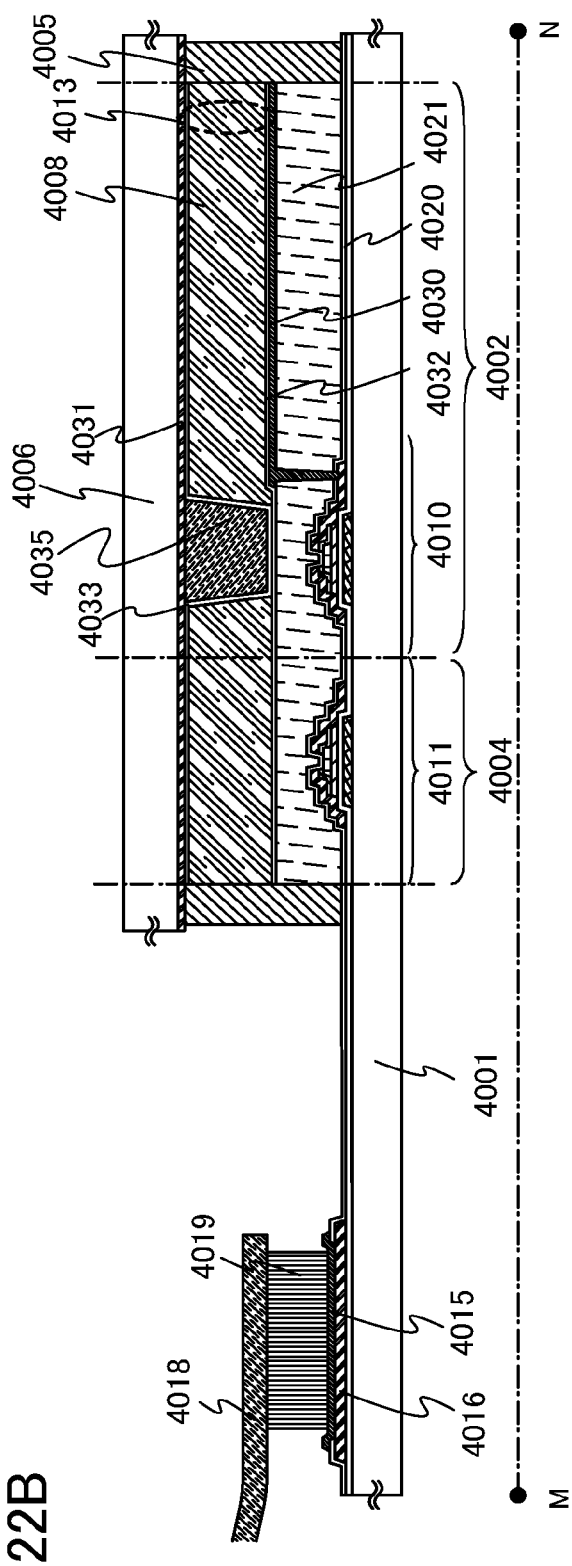

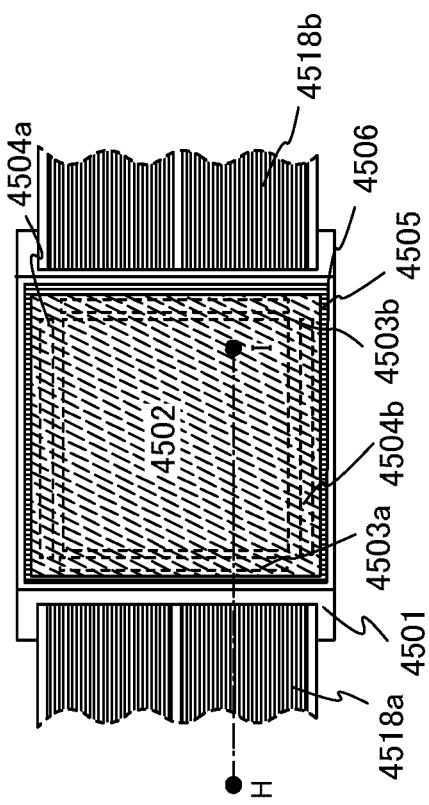
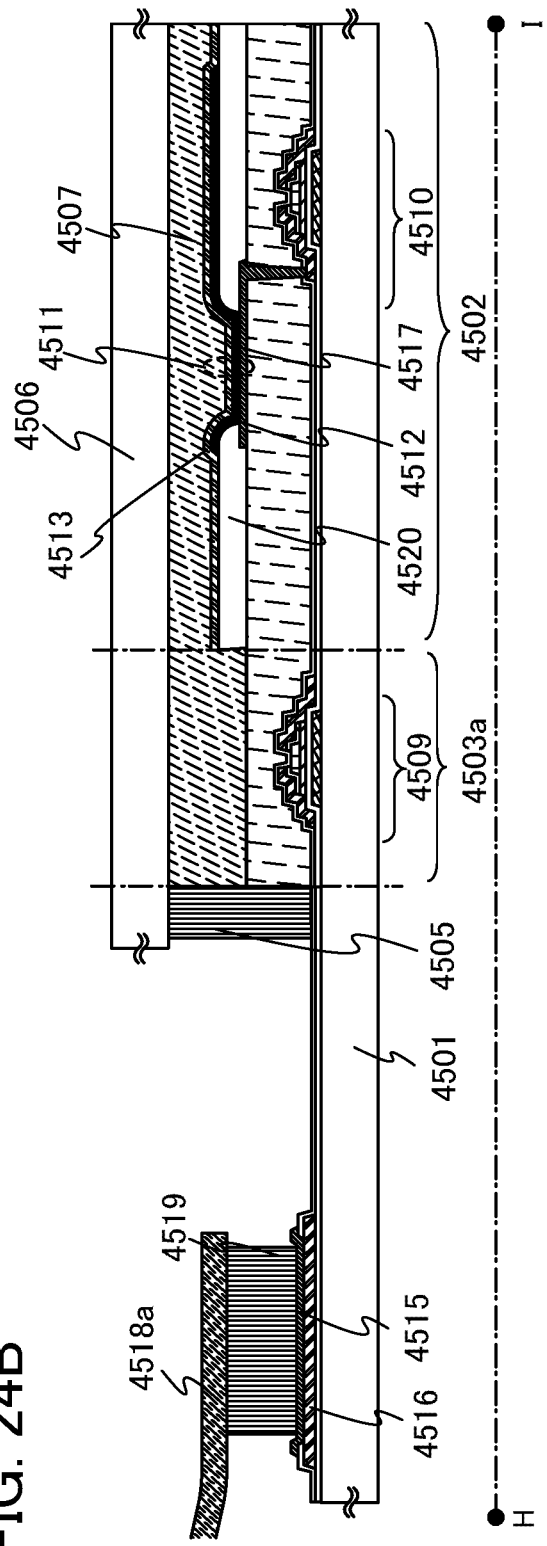
FIG. 24A
FIG. 24B

DISPLAY DEVICE

BACKGROUND OF THE INVENTION

1. Field of the Invention

The present invention relates to a display device in which an oxide semiconductor is used.

2. Description of the Related Art

As typically seen in a liquid crystal display device, a thin film transistor formed over a flat plate such as a glass substrate is manufactured using amorphous silicon or polycrystalline silicon. A thin film transistor manufactured using amorphous silicon has low field effect mobility, but can be formed over a larger glass substrate. In contrast, a thin film transistor manufactured using a crystalline silicon has high field effect mobility, but due to a crystallization step such as laser annealing, such a transistor is not always suitable for being formed over a larger glass substrate.

In view of the foregoing, attention has been drawn to a technique by which a thin film transistor is manufactured using an oxide semiconductor and such a transistor is applied to an electronic appliance or an optical device. For example, Patent Document 1 and Patent Document 2 disclose a technique by which a thin film transistor is manufactured using zinc oxide or an In—Ga—Zn—O-based oxide semiconductor for an oxide semiconductor film and such a transistor is used as a switching element or the like of an image display device.

CITATION LIST

[Patent Document 1]
Japanese Published Patent Application No. 2007-123861
[Patent Document 2]
Japanese Published Patent Application No. 2007-096055

SUMMARY OF THE INVENTION

The field effect mobility of a thin film transistor using an oxide semiconductor for a channel formation region is higher than that of a thin film transistor using amorphous silicon. The oxide semiconductor film can be formed by a sputtering method or the like at a temperature lower than or equal to 300° C. Its manufacturing process is easier than that of a thin film transistor using polycrystalline silicon.

Such an oxide semiconductor is expected to be used for forming a thin film transistor on a glass substrate, a plastic substrate, or the like, and to be applied to a liquid crystal display device, an electroluminescent display device, an electronic paper, or the like.

With an increase in the definition of a display device, the number of pixels is increased, and thus the numbers of gate lines and signal lines are increased. Due to the increase in the numbers of gate lines and signal lines, it is difficult to mount an IC chip having a driver circuit for driving the gate lines and the signal lines by bonding or the like, which causes an increase in manufacturing costs.

Further, another object of the present invention is to reduce contact resistance or the like between wirings that connect elements in order to achieve high-speed driving of the driver circuit. For example, high contact resistance between a gate wiring and an upper wiring might distort an input signal.

Further, another object of the present invention is to provide a structure of a display device, which is capable of reducing the number of contact holes and an area occupied by a driver circuit.

In an embodiment of the present invention, a pixel portion and at least a part of a driver circuit for driving the pixel portion are formed using inversed staggered thin film transistors in each of which an oxide semiconductor are used over the same substrate. The driver circuit as well as the pixel portion are provided over the same substrate, whereby manufacturing costs are reduced.

As an oxide semiconductor used in this specification, a thin film of a material represented by $InMO_3(ZnO)_m$ (m>0) is formed, and a thin film transistor in which the thin film is used as a semiconductor layer is manufactured. Note that M denotes one or more of metal elements selected from gallium (Ga), iron (Fe), nickel (Ni), manganese (Mn), and cobalt (Co). In addition to a case where only Ga is contained as M, there is a case where Ga and the above metal elements other than Ga, for example, Ga and Ni or Ga and Fe are contained as M. Moreover, in the oxide semiconductor, in some cases, a transition metal element such as Fe or Ni or an oxide of the transition metal is contained as an impurity element in addition to a metal element contained as M. In this specification, this thin film is also referred to as an "In—Ga—Zn—O-based non-single-crystal film".

Table 1 shows a typical example of measurement by inductively coupled plasma mass spectrometry (ICP-MS). An oxide semiconductor film that is obtained under Condition 1 where a target in which the ratio of $In_2O_3$ to $Ga_2O_3$ and ZnO is 1:1:1 (the ratio of In to Ga and Zn being 1:1:0.5) is used and the flow rate of an argon gas in a sputtering method is 40 sccm is $InGa_{0.95}Zn_{0.41}O_{3.33}$. In addition, an oxide semiconductor film obtained under Condition 2 where the flow rates of an argon gas and oxygen in a sputtering method are 10 sccm and 5 sccm respectively is $InGa_{0.94}Zn_{0.40}O_{3.31}$.

TABLE 1

| Flow Ratio | Composition (Atomic %) | | | | |
|---|---|---|---|---|---|
| $Ar/O_2$ | In | Ga | Zn | O | Composition Formula |
| 40/0 | 17.6 | 16.7 | 7.2 | 58.6 | $InGa_{0.95}Zn_{0.41}O_{3.33}$ |
| 10/5 | 17.7 | 16.7 | 7 | 58.6 | $InGa_{0.94}Zn_{0.40}O_{3.31}$ |

Further, Table 2 shows results of quantification performed using Rutherford backscattering spectrometry (RBS) instead of ICP-MS.

TABLE 2

| Flow Ratio | Composition (Atomic %) | | | | | |
|---|---|---|---|---|---|---|
| $Ar/O_2$ | In | Ga | Zn | O | Ar | Composition Formula |
| 40/0 | 17 | 15.8 | 7.5 | 59.4 | 0.3 | $InGa_{0.93}Zn_{0.44}O_{3.49}$ |
| 10/5 | 16 | 14.7 | 7.2 | 61.7 | 0.4 | $InGa_{0.92}Zn_{0.45}O_{3.86}$ |

According to the results of the measurement of the sample in Condition 1 by RBS, an oxide semiconductor film is $InGa_{0.93}Zn_{0.44}O_{3.49}$. In addition, according to the results of the measurement of the sample in Condition 2 by RBS, an oxide semiconductor film is $InGa_{0.92}Zn_{0.45}O_{3.86}$.

An amorphous structure is observed in the In—Ga—Zn—O-based non-single-crystal film by X-ray diffraction (XRD). Note that heat treatment is performed on the In—Ga—Zn—O-based non-single-crystal film of the examined sample at 200 to 500° C., typically 300 to 400° C., for 10 minutes to 100 minutes after the film is formed by a sputtering method.

In addition, a thin film transistor having electric characteristics such as an on/off ratio of greater than or equal to $10^9$ and a mobility of greater than or equal to 10 at a gate voltage of ±20 V can be manufactured.

It is useful to use a thin film transistor having such electric characteristics for a driver circuit. For example, a gate line driver circuit includes a shift register circuit for sequentially transferring a gate signal, a buffer circuit, and the like; and a source line driver circuit includes a shift register circuit for sequentially transferring a gate signal, an analog switch for switching on and off of transfer of an image signal to a pixel, and the like. A TFT in which an oxide semiconductor film having a higher mobility than a TFT in which amorphous silicon is used is capable of driving a shift register circuit at high speed.

Further, when at least a part of a driver circuit for driving a pixel portion is formed using a thin film transistor in which an oxide semiconductor is used, the circuit is formed using n-channel TFTs, and a circuit illustrated in FIG. 1B is used as a basic unit. In addition, in the driver circuit, a gate electrode is directly connected to a source wiring or a drain wiring, whereby a favorable contact can be obtained, which leads to a reduction in contact resistance. In the driver circuit, connecting the gate electrode to a source wiring or a drain wiring with another conductive film, e.g., a transparent conductive film interposed therebetween might cause an increase in the number of contact holes, an increase in an area occupied by the contact holes due to the increase in the number of contact holes, or an increase in contact resistance and wiring resistance, and might even complicate the process.

An embodiment of the present invention which is disclosed in this specification is a display device including a pixel portion and a driver circuit. The pixel portion includes a first thin film transistor including at least a first oxide semiconductor layer and a first channel protective layer in contact with the first oxide semiconductor layer. The driver circuit includes a second thin film transistor including at least a second oxide semiconductor layer and a second channel protective layer in contact with the second oxide semiconductor layer and a third thin film transistor including a third oxide semiconductor layer and a third channel protective layer in contact with the third oxide semiconductor layer. A wiring that is in direct contact with a gate electrode of the second thin film transistor provided below the second oxide semiconductor layer is provided above the third oxide semiconductor layer. The wiring is a source or drain wiring of the third thin film transistor which is electrically connected to the third oxide semiconductor layer.

An embodiment of the present invention achieves at least one of the above objects.

Further, the thin film transistor used for the embodiment of the present invention may include a fourth oxide semiconductor layer having smaller thickness and higher conductivity than the third oxide semiconductor layer, between the source wiring and the oxide semiconductor layer serving as a channel formation region (the third semiconductor layer in the above structure) or between the drain wiring and the oxide semiconductor layer serving as the channel formation region (the third semiconductor layer in the above structure).

The fourth oxide semiconductor layer exhibits n-type conductivity and functions as a source or drain region.

The third oxide semiconductor layer may have an amorphous structure, and the fourth oxide semiconductor layer may include crystal grains (nanocrystals) in an amorphous structure. These crystal grains (nanocrystals) in the fourth oxide semiconductor layer each have a diameter of 1 to 10 nm, typically about 2 to 4 nm.

Further, as the fourth oxide semiconductor layer serving as a source or drain region (an $n^+$-type layer), an In—Ga—Zn—O-based non-single-crystal film can be used. Alternatively, any one of In, Ga, and Zn may be replaced with tungsten, molybdenum, titanium, nickel, or aluminum.

An insulating layer may be provided to cover the first thin film transistor, the second thin film transistor, and the third thin film transistor which are included in the display device and to be in contact with the first channel protective layer, the second channel protective layer, and the third channel protective layer.

Further, since the thin film transistor is easily broken by static electricity and the like, a protection circuit for protecting the driver circuits is preferably provided over the same substrate for a gate line or a source line. The protection circuit is preferably formed using a nonlinear element in which an oxide semiconductor is used.

Note that ordinal numbers such as "first" and "second" in this specification are used for convenience. Therefore, they do not denote the order of steps, the stacking order of layers, and particular names which specify the invention.

Moreover, as a display device including a driver circuit, a light-emitting display device in which a light-emitting element is used and a display device in which an electrophoretic display element is used, which is also referred to as an "electronic paper", are given in addition to a liquid crystal display device.

In the light-emitting display device in which a light-emitting element is used, a plurality of thin film transistors are included in a pixel portion, and also in the pixel portion, there is a region where a gate electrode of one thin film transistor is directly connected to a source wiring or a drain wiring of another transistor. In addition, in the driver circuit of the light-emitting display device in which a light-emitting element is used, there is a region where a gate electrode of a thin film transistor is directly connected to a source wiring or a drain wiring of the thin film transistor.

Note that the semiconductor device in this specification refers to all the devices which can operate by using semiconductor characteristics, and an electro-optical device, a semiconductor circuit, and an electronic appliance are all included in the semiconductor devices.

By use of thin film transistor in which an oxide semiconductor in a gate line driver circuit or a source line driver circuit, whereby manufacturing costs are reduced. Moreover, a gate electrode of the thin film transistor used for the driver circuit is directly connected to a source wiring or a drain wiring, whereby a display device in which the number of contact holes can be reduced and an area occupied by the driver circuit is reduced can be provided.

Therefore, according to an embodiment of the present invention, a display device having high electrical properties and high reliability can be provided at low costs.

BRIEF DESCRIPTION OF THE DRAWINGS

FIGS. 5A to 5C illustrate a method for manufacturing a semiconductor device.

FIGS. 6A to 6C illustrate a method for manufacturing a semiconductor device.

FIGS. 11A1, 11A2, 11B1 and 11B2 illustrate a semiconductor device.

FIGS. 22A1, 22A2 and 22B illustrate a semiconductor device.

FIGS. 24A and 24B illustrate a semiconductor device.

DETAILED DESCRIPTION OF THE INVENTION

Figure 1A:
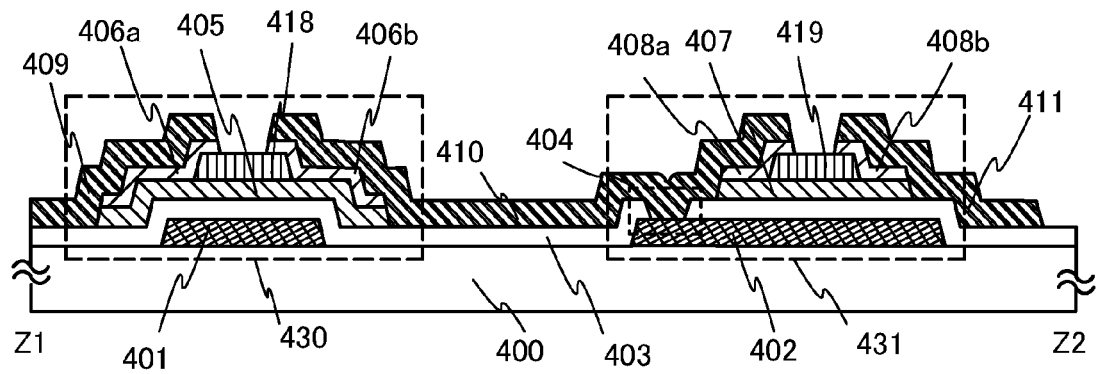
FIGS. 1A to 1C illustrate a semiconductor device.

Embodiments will be described in detail with reference to the accompanying drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiments below. Note that in a structure of an embodiment of the present invention which will be described below, identical components or components having similar functions throughout the drawings are denoted by the same reference numerals and do not require repeated explanations.

Embodiment 1

In Embodiment 1, an embodiment of the present invention will be described based on an example in which an inverter circuit is formed using two n-channel thin film transistors.

A driver circuit for driving a pixel portion is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that when the threshold voltage of the n-channel TFT is positive, the n-channel TFT is defined as an enhancement type transistor, while when the threshold voltage of the n-channel TFT is negative, the n-channel TFT is defined as a depletion type transistor, and this specification follows the above definitions.

The pixel portion and the driver circuit are formed over the same substrate. In the pixel portion, on and off of voltage application to a pixel electrode are switched using enhancement type transistors arranged in a matrix. An oxide semiconductor is used for these enhancement type transistors arranged in the pixel portion. Since the enhancement type transistor has electric characteristics such as an on/off ratio of greater than or equal to $10^9$ at a gate voltage of ±20 V, leakage current is small and low power consumption drive can be realized.

Figure 1B:
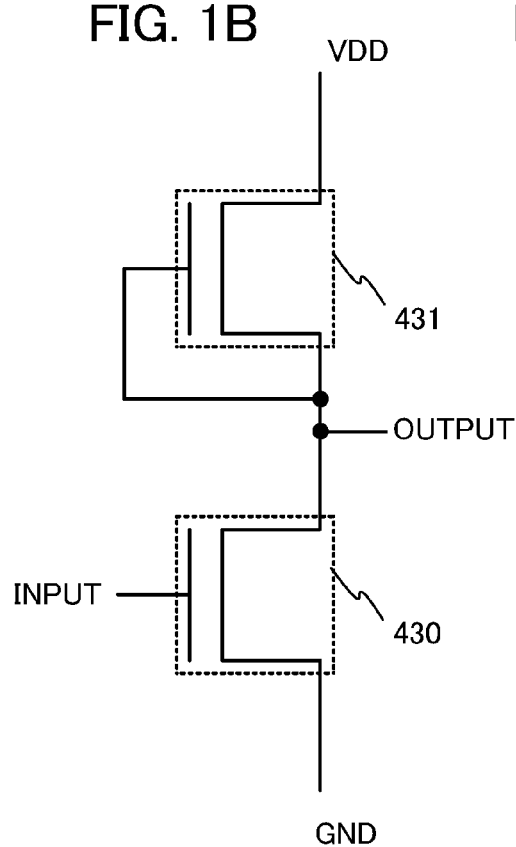
Figure 1C:
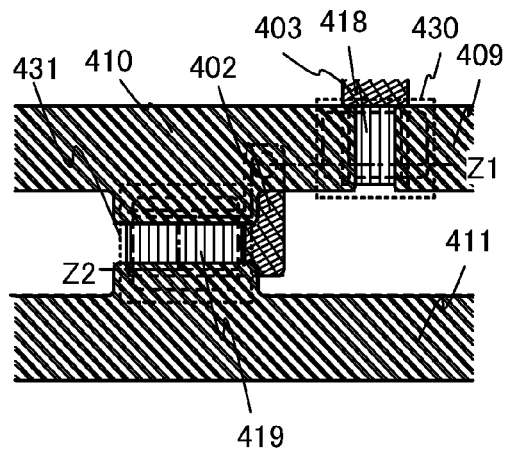

FIG. 1A illustrates a cross-sectional structure of the inverter circuit of the driver circuit. Note that a first thin film transistor 430 and a second thin film transistor 431 which are illustrated in FIGS. 1A to 1C are each an inverted staggered thin film transistor having a channel protective layer and exemplifies a thin film transistor in which a wiring is provided over a semiconductor layer with a source or drain regions interposed therebetween.

In FIG. 1A, a first gate electrode 401 and a second gate electrode 402 are provided over a substrate 400. The first gate electrode 401 and the second gate electrode 402 can be formed to have a single-layer structure or a stacked-layer structure using a metal material such as molybdenum, titanium, chromium, tantalum, tungsten, aluminum, copper, neodymium, or scandium, or an alloy material containing any of these materials as the main component.

For example, as a two-layer structure of each of the first gate electrode 401 and the second gate electrode 402, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Further, over the gate insulating layer 403 covering the first gate electrode 401 and the second gate electrode 402, a first oxide semiconductor layer 405 and a second oxide semiconductor layer 407 are provided.

A first channel protective layer 418 is provided on and in contact with the first oxide semiconductor layer 405 overlapped with the first gate electrode 401. A second channel protective layer 419 is provided on and in contact with the second oxide semiconductor layer 407 overlapped with the second gate electrode 402.

The first channel protective layer 418 is provided over a channel formation region of the first oxide semiconductor layer 405, and the second channel protective layer 419 is provided over a channel formation region of the second oxide semiconductor layer 407. This structure can prevent damage to the channel formation regions of the first oxide semiconductor layer 405 and the second oxide semiconductor layer 407 (e.g., a reduction in thickness due to plasma or an etchant in etching, or oxidation) in the manufacturing process. Therefore, reliability of the first thin film transistor 430 and the second thin film transistor 431 can be improved.

Further, over the first oxide semiconductor layer 405, a first wiring 409 and a second wiring 410 are provided. The second wiring 410 is directly connected to the second gate electrode 402 through a contact hole 404 formed in the gate insulating layer 403. In addition, a third wiring 411 is provided over the second oxide semiconductor layer 407.

The first thin film transistor 430 includes the first gate electrode 401 and the first oxide semiconductor layer 405 overlapped with the gate electrode 401 with the gate insulating layer 403 interposed therebetween, and the first wiring 409 is a power supply line at a ground potential (a ground power supply line). This power supply line at a ground potential may be a power supply line to which a negative voltage VDL is applied (a negative power supply line).

In addition, the second thin film transistor 431 includes the second gate electrode 402 and the second oxide semiconductor layer 407 overlapped with the second gate electrode 402 with the gate insulating layer 403 interposed therebetween, and the third wiring 411 is a power supply line to which a positive voltage VDD is applied (a positive power supply line).

Further, an $n^+$-type layer 406a is provided between the first oxide semiconductor layer 405 and the first wiring 409, and an $n^+$-type layer 406b is provided between the first oxide semiconductor layer 405 and the second wiring 410. Furthermore, an $n^+$-type layer 408a is provided between the second oxide semiconductor layer 407 and the second wiring 410, and an $n^+$-type layer 408b is provided between the second oxide semiconductor layer 407 and the third wiring 411.

In Embodiment 1, the $n^+$-type layers 406a, 406b, 408a, and 408b each functioning as a source region or a drain region are formed of In—Ga—Zn—O-based non-single-crystal films, and deposition conditions thereof are different from those of the first oxide semiconductor layer 405 and the second oxide semiconductor layer 407. Thus, the $n^+$-type layers 406a, 406b, 408a, and 408b are oxide semiconductor layers having lower resistance than the first oxide semiconductor layer 405 and the second oxide semiconductor layer 407. For example, when formed of oxide semiconductor films under Condition 1 shown in the above Table 1 where the flow rate of an argon gas is 40 sccm in a sputtering method, the $n^+$-type layers 406a, 406b, 408a, and 408b have n-type conductivity and an activation energy (ΔE) of 0.01 to 0.1 eV. Note that in Embodiment 1, the $n^+$-type layers 406a, 406b, 408a, and 408b are In—Ga—Zn—O-based non-single-crystal films and include at least an amorphous component. The $n^+$-type layers 406a, 406b, 408a, and 408b may include crystal grains (nanocrystals) in an amorphous structure. These crystal grains (nanocrystals) in the $n^+$-type layers 406a, 406b, 408a, and 408b each have a diameter of 1 to 10 nm, typically about 2 to 4 nm.

By the provision of the $n^+$-type layers 406a, 406b, 408a, and 408b, the first wiring 409 and the second wiring 410 which are metal layers can have a good junction with the first oxide semiconductor layer 405, and the second wiring 410 and the third wiring 411 which are metal layers can have a good junction with the second oxide semiconductor layer 407, so that stable operation can be realized in terms of heat in comparison with a Schottky junction. In addition, willing provision of the $n^+$-type layer is effective in supplying carriers to the channel (on the source side), stably absorbing carriers from the channel (on the drain side), or preventing a resistance component from being formed at an interface between the wiring and the oxide semiconductor layer. Moreover, since resistance is reduced, good mobility can be ensured even with a high drain voltage.

As illustrated in FIG. 1A, the second wiring 410 which is electrically connected to both the first oxide semiconductor layer 405 and the second oxide semiconductor layer 407 is directly connected to the second gate electrode 402 of the second thin film transistor 431 through the contact hole 404 formed in the gate insulating layer 403. By the direct connection between the second wiring 410 and the second gate electrode 402, favorable contact can be obtained, which leads to a reduction in contact resistance. In comparison with the case where the second gate electrode 402 and the second wiring 410 are connected to each other with another conductive film, e.g., a transparent conductive film interposed therebetween, a reduction in the number of contact holes and a reduction in an area occupied by the driver circuit by the reduction in the number of contact holes can be achieved.

Further, FIG. 1C is a top view of the inverter circuit of the driver circuit. In FIG. 1C, a cross section taken along the chain line Z1-Z2 corresponds to FIG. 1A.

Further, FIG. 1B illustrates an equivalent circuit of the EDMOS circuit. The circuit connection illustrated in FIGS. 1A and 1C corresponds to that illustrated in FIG. 1B. An example in which the first thin film transistor 430 is an enhancement type n-channel transistor and the second thin film transistor 431 is a depletion type n-channel transistor is illustrated.

In order to manufacture an enhancement type n-channel transistor and a depletion type n-channel transistor over the same substrate, for example, the first oxide semiconductor layer 405 and the second semiconductor layer 407 are formed using different materials or under different conditions. Alternatively, an EDMOS circuit may be formed in such a manner that gate electrodes are provided over and under the oxide semiconductor layer to control the threshold value and a voltage is applied to the gate electrodes so that one of the TFTs is normally on while the other TFT is normally off.

Embodiment 2

Figure 2A:
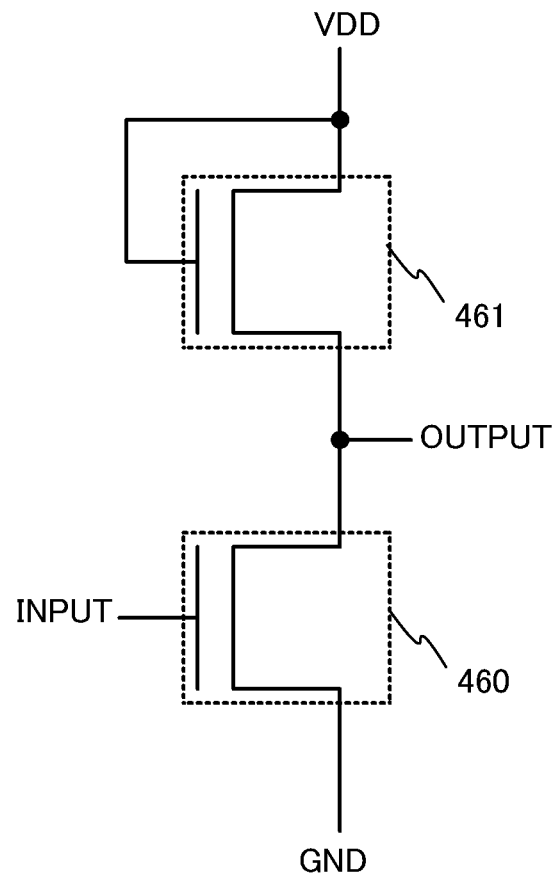
FIGS. 2A and 2B illustrate a semiconductor device.

Although the example of the EDMOS circuit is described in Embodiment 1, an equivalent circuit of an EEMOS circuit is illustrated in FIG. 2A in Embodiment 2. In the equivalent circuit illustrated in FIG. 2A, a driver circuit is formed using a combination of enhancement type n-channel transistors.

Figure 2B:
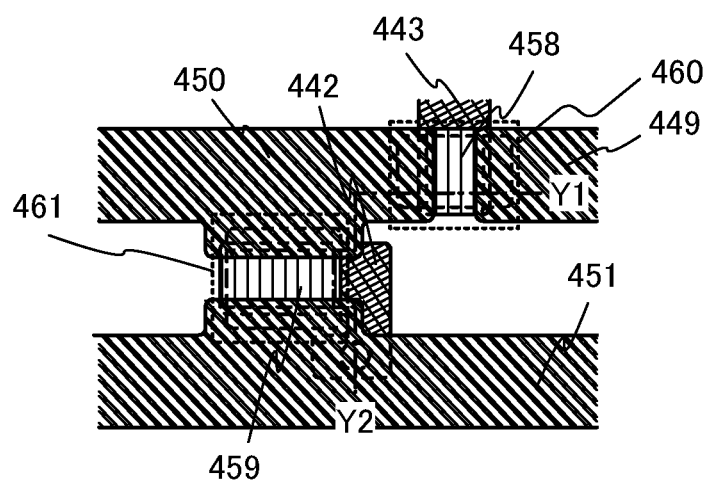

It can be said that it is preferable to use the circuit configuration illustrated in FIG. 2A in which enhancement type n-channel transistors of the same type are combined for the driver circuit, in which case a transistor used for a pixel portion is also formed of an enhancement type n-channel transistor which is the same type as that used for the driver circuit, and the number of manufacturing steps is not increased. In addition, FIG. 2B is a top view. An equivalent circuit of a cross section taken along the chain line Y1-Y2 in FIG. 2B corresponds to FIG. 2A.

Note that the first thin film transistor 460 and the second thin film transistor 461 which are illustrated in FIGS. 2A and 2B are each an inversed staggered thin film transistor having a channel protective layer and exemplify a thin film transistor in which a wiring is formed over a semiconductor layer with a source region or a drain region interposed therebetween.

Figure 3A:
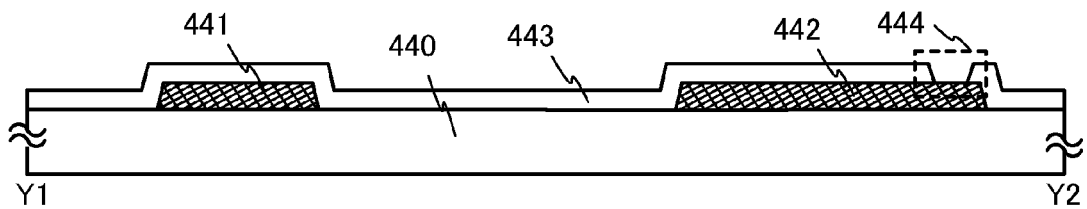
FIGS. 3A to 3C illustrate a method for manufacturing a semiconductor device.
Figure 3B:
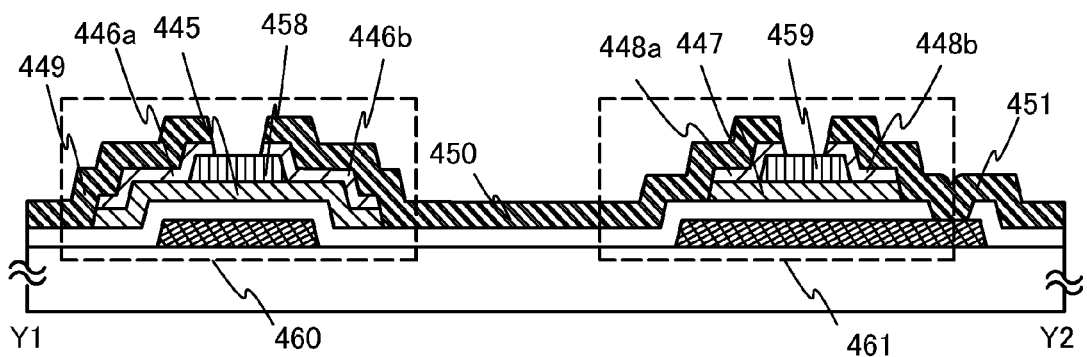
Figure 3C:
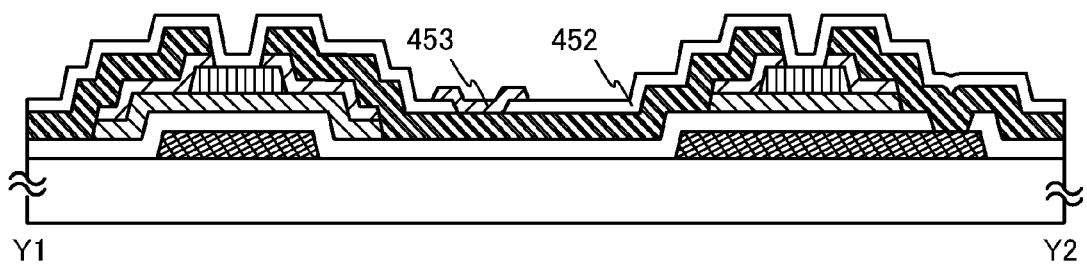

In addition, an example of a manufacturing process of an inverter circuit is illustrated in FIGS. 3A to 3C.

A first conductive film is formed over a substrate 440 by a sputtering method and the first conductive film is etched as selected using a first photomask to form a first gate electrode 441 and a second gate electrode 442. Next, a gate insulating layer 443 for covering the first gate electrode 441 and the second gate electrode 442 is formed by a plasma CVD method or a sputtering method. The gate insulating layer 443 can be formed to have a single layer or a stack of a silicon oxide layer, a silicon nitride layer, a silicon oxynitride layer, or a silicon nitride oxide layer by a CVD method, a sputtering method, or the like. Alternatively, the gate insulating layer 443 can be formed of a silicon oxide layer by a CVD method using an organosilane gas. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Next, the gate insulating layer 443 is etched as selected using a second photomask to form a contact hole 444 that reaches the second gate electrode 442. A cross-sectional view of the steps so far corresponds to FIG. 3A.

Next, an oxide semiconductor film is formed by a sputtering method, and thereover, a first channel protective layer 458 and a second channel protective layer 459 are formed. For the first channel protective layer 458 and the second channel protective layer 459, an insulating layer is formed over the oxide semiconductor film and etched as selected using a third photomask.

Note that preferably, before the formation of the oxide semiconductor film by a sputtering method, dust attached to a surface of the gate insulating layer 443 and a bottom surface of the contact hole 444 is removed by reverse sputtering in which an argon gas is introduced to generate plasma. The reverse sputtering refers to a method in which, without application of a voltage to a target side, an RF power source is used for application of a voltage to a substrate side in an argon atmosphere to modify a surface. Note that instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

Next, an n$^+$-type layer is formed over the oxide semiconductor film, the first channel protective layer 458, and the second channel protective layer 459.

Next, the oxide semiconductor film and the n$^+$-type layer are etched using a fourth photomask to form a first oxide semiconductor layer 445 and a second oxide semiconductor layer 447. Then, a second conductive film is formed by a sputtering method and the second conductive film is etched as selected using a fifth photomask to form a first wiring 449, a second wiring 450, and a third wiring 451. The third wiring 451 is directly in contact with the second gate electrode 442 through the contact hole 444. Note that reverse sputtering in which plasma is generated by introduction of an argon gas is preferably performed to remove dust attached to a surface of the gate insulating layer 443, a surface of the n$^+$-type layer, and the bottom surface of the contact hole 444 before the second conductive film is formed by a sputtering method. The reverse sputtering refers to a method in which, without application of a voltage to a target side, an RF power source is used for application of a voltage to a substrate side in an argon atmosphere to modify a surface. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

Note that in the etching of the second conductive film, parts of the n$^+$-type layer are also etched to form n$^+$-type layers 446a, 446b, 448a, and 448b. When this etching step is finished, a first thin film transistor 460 and a second thin film transistor 461 are completed. A cross-sectional view of the steps so far corresponds to FIG. 3B.

Next, heat treatment is performed at 200 to 600° C. in an air atmosphere or a nitrogen atmosphere. Note that the timing of this heat treatment is not particularly limited and the heat treatment may be performed anytime as long as it is performed after the formation of the oxide semiconductor film.

Next, a protective layer 452 is formed and the protective layer 452 is etched as selected using a sixth photomask to form a contact hole. After that, a third conductive film is formed. Lastly, the third conductive film is etched as selected using a seventh photomask to form a connection wiring 453 that is electrically connected to the second wiring 410. A cross-sectional view of the steps so far corresponds to FIG. 3C.

In a light-emitting display device in which a light-emitting element is used, a pixel portion has a plurality of thin film transistors, and the pixel portion also has a contact hole for electrically connecting a gate electrode of one thin film transistor to a source wiring or a drain wiring of another transistor. This contact portion can be formed using the same mask as in the step of forming the contact hole in the gate insulating layer using the second photomask.

Further, as for a liquid crystal display device or an electronic paper, in a terminal portion for connection to an external terminal such as an FPC, the same mask can be used for a step of forming a contact hole that reaches a gate wiring and a step of forming a contact hole in a gate insulating layer using the second photomask.

Note that the order of the steps described above is merely an example and there is no limitation to this order. For example, although the number of photomasks increases by one, a photomask for etching the second conductive film and a photomask for etching a part of the n$^+$-type layer may be separately used.

Embodiment 3

In Embodiment 3, an example of a manufacturing process of an inverter circuit which is different from the process described in Embodiment 2 will be described using FIGS. 4A to 4D.

A first conductive film is formed over the substrate 440 by a sputtering method and the first conductive film is etched as selected using a first photomask to form the first gate electrode 441 and the second gate electrode 442. Next, the gate insulating layer 443 for covering the first gate electrode 441 and the second gate electrode 442 is formed by a plasma CVD method or a sputtering method.

Next, an oxide semiconductor film is formed by a sputtering method, and thereover, a first channel protective layer 458 and a second channel protective layer 459 are formed. For the first channel protective layer 458 and the second channel protective layer 459, an insulating layer is formed over the oxide semiconductor film and etched as selected using a second photomask.

Next, an n⁺-type layer is formed over the oxide semiconductor film, the first channel protective layer 458, and the second channel protective layer 459.

Figure 4A:
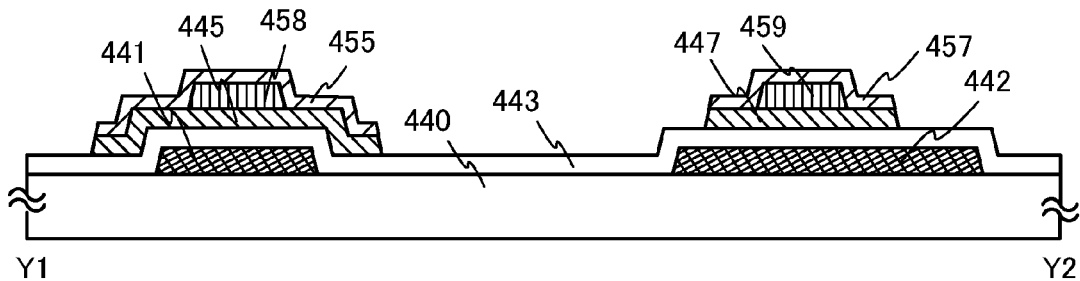
FIGS. 4A to 4D illustrate a method for manufacturing a semiconductor device.
Figure 4B:
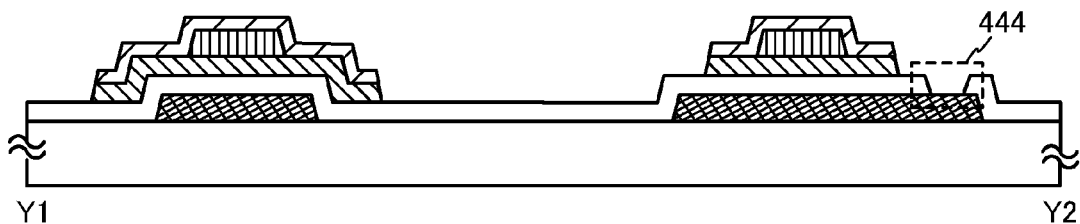

Next, the oxide semiconductor film and the n⁺-type layer are etched as selected using the third photomask to form the first oxide semiconductor layer 445, the second oxide semiconductor layer 447, and the n⁺-type layers 455 and 457. Thus, the following layers are formed: the first oxide semiconductor layer 445 overlapped with the first gate electrode 441 with the gate insulating layer 443 interposed therebetween, the first channel protective layer 458, and the n⁺-type layer 455; and the second oxide semiconductor layer 447 overlapped with the second gate electrode 442 with the gate insulating layer 443 interposed therebetween, the second channel protective layer 459, and the n⁺-type layer 457. A cross-sectional view of the steps so far is illustrated in FIG. 4A.

Next, the gate insulating layer 443 is etched as selected using a second photomask to form the contact hole 444 that reaches the second gate electrode 442. A cross-sectional view of the steps so far corresponds to FIG. 4B.

Next, the second conductive film is formed by a sputtering method and etched as selected using a fifth photomask to form the first wiring 449, the second wiring 450, and the third wiring 451. Note that preferably, before the formation of the second conductive film by a sputtering method, dust attached to the surface of the gate insulating layer 443, surfaces of the n⁺-type layers 455 and 457, and the bottom surface of the contact hole 444 is removed by reverse sputtering in which an argon gas is introduced to generate plasma. The reverse sputtering refers to a method in which, without application of a voltage to a target side, an RF power source is used for application of a voltage to a substrate side in an argon atmosphere to modify a surface. Note that instead of an argon atmosphere, a nitrogen atmosphere, a helium atmosphere, or the like may be used. Alternatively, an argon atmosphere to which oxygen, hydrogen, N₂O, or the like is added may be used. Further alternatively, an argon atmosphere to which Cl₂, CF₄, or the like is added may be used.

In the process of Embodiment 3, since the second conductive film can be formed without formation of any other film after the contact hole 444 is formed, the number of steps involving exposure of the bottom surface of the contact hole is smaller than that in Embodiment 2, so that a material for the gate electrode can be chosen from a wider range. In Embodiment 2, since the oxide semiconductor film is formed in contact with the gate electrode surface exposed in the contact hole 444, etching conditions or a material of the gate electrode are needed such that the material of the gate electrode is not etched through the step of etching the oxide semiconductor film.

Note that in the etching of the second conductive film, parts of the n⁺-type layer are also etched to form the n⁺-type layers 446a, 446b, 448a, and 448b. When this etching step is finished, the first thin film transistor 460 and the second thin film transistor 461 are completed.

The first thin film transistor 460 includes the first gate electrode 441 and the first oxide semiconductor layer 445 overlapped with the gate electrode 441 with the gate insulating layer 443 interposed therebetween, and the first wiring 449 is a power supply line at a ground potential (a ground power supply line). This power supply line at a ground potential may be a power supply line to which a negative voltage VDL is applied (a negative power supply line).

The second thin film transistor 461 includes the second gate electrode 442 and the second oxide semiconductor layer 447 overlapped with the second gate electrode 442 with the gate insulating layer 443 interposed therebetween, and the third wiring 451 is a power supply line to which a positive voltage VDD is applied (a positive power supply line).

Further, the n⁺-type layer 446a is provided between the first oxide semiconductor layer 445 and the first wiring 449, and the n⁺-type layer 446b is provided between the first oxide semiconductor layer 445 and the second wiring 450. Furthermore, the n⁺-type layer 448a is provided between the second oxide semiconductor layer 447 and the second wiring 450, and the n⁺-type layer 448b is provided between the second oxide semiconductor layer 447 and the third wiring 451.

Figure 4C:
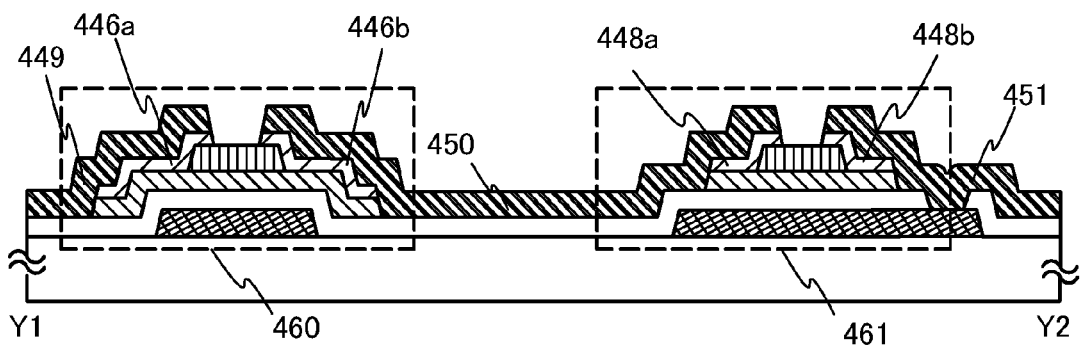
Figure 4D:
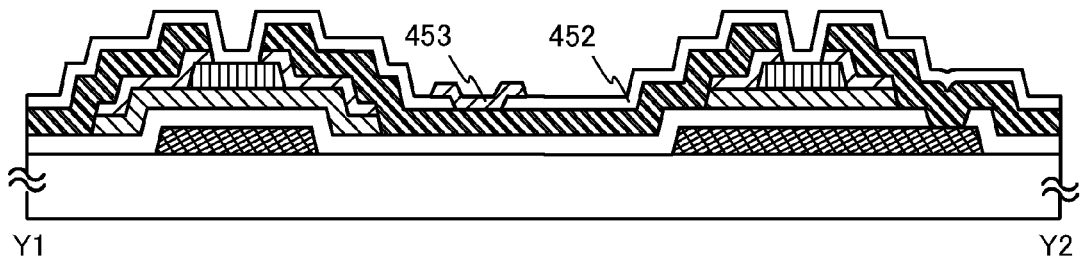

A cross-sectional view of the steps so far is illustrated in FIG. 4C.

Next, heat treatment is performed at 200 to 600° C. in an air atmosphere or a nitrogen atmosphere. Note that the timing of this heat treatment is not particularly limited and the heat treatment may be performed anytime as long as it is performed after the formation of the oxide semiconductor film.

Next, the protective layer 452 is formed and the protective layer 452 is etched as selected using a sixth photomask to form a contact hole. After that, a third conductive film is formed. Lastly, the third conductive film is etched as selected using a seventh photomask to form the connection wiring 453 that is electrically connected to the second wiring 450.

In the light-emitting display device in which a light-emitting element is used, a plurality of thin film transistors are included in a pixel portion, and also in the pixel portion, there is a region where a gate electrode of one thin film transistor is directly connected to a source wiring or a drain wiring of another transistor. This contact portion can be formed using the same mask as in the step of forming the contact hole in the gate insulating layer using the fourth photomask.

Further, as for a liquid crystal display device or an electronic paper, in a terminal portion for connection to an external terminal such as an FPC, the same mask can be used for a step of forming a contact hole that reaches a gate wiring and a step of forming a contact hole in a gate insulating layer using the fourth photomask.

Note that the order of the steps described above is merely an example and there is no limitation to this order. For example, although the number of photomasks increases by one, a photomask for etching the second conductive film and a photomask for etching parts of the n⁺-type layer may be separately used for each etching.

Embodiment 4

In Embodiment 4, a manufacturing process of a display device including a thin film transistor according to an embodiment of the present invention will be described using FIGS. 5A to 5C to FIG. 12.

In FIG. 5A, as a substrate 100 having a light-transmitting property, a glass substrate of barium borosilicate glass, aluminoborosilicate glass, or the like typified by #7059 glass, #1737 glass, or the like manufactured by Corning, Inc. can be used.

Figure 7:
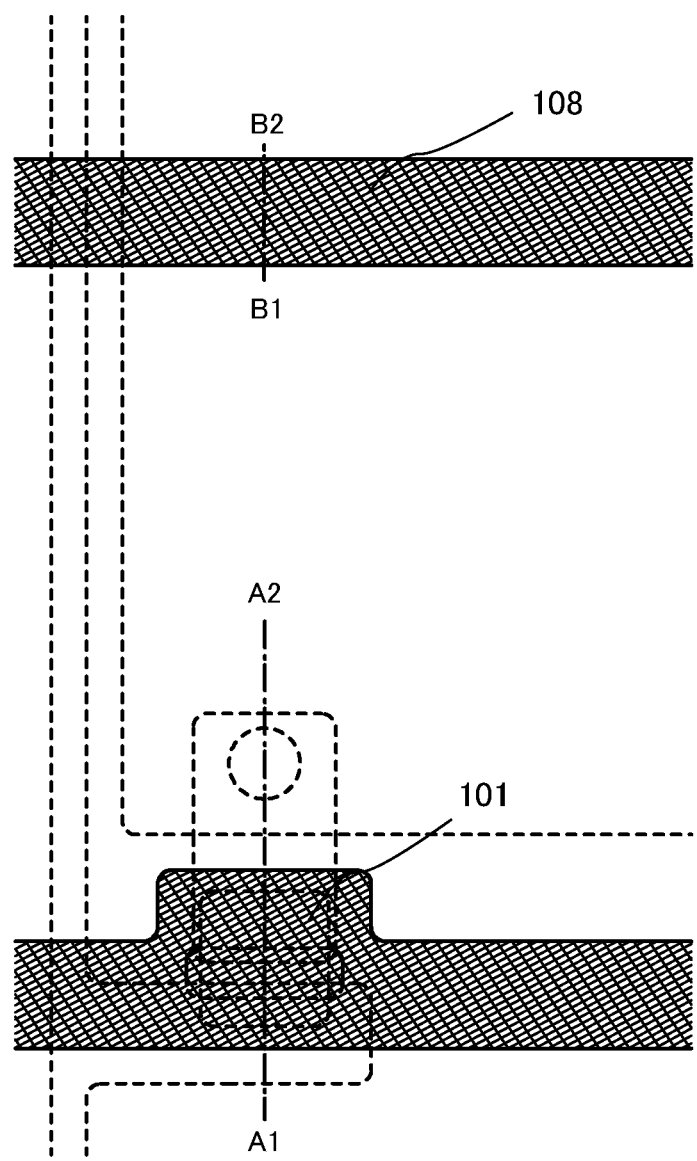
FIG. 7 illustrates a method for manufacturing a semiconductor device.

Next, a conductive layer is formed over the entire surface of the substrate 100. After that, a first photolithography step is performed to form a resist mask, and unnecessary portions are removed by etching, thereby forming wirings and an electrode (a gate wiring including a gate electrode layer 101, a capacitor wiring 108, and a first terminal 121). At this time, the etching is performed so that at least end portions of the gate electrode layer 101 have a tapered shape. A cross-sectional view at this stage is illustrated in FIG. 5A. Note that a top view at this stage corresponds to FIG. 7.

The gate wiring including the gate electrode layer 101, the capacitor wiring 108, and the first terminal 121 of a terminal portion are preferably formed from a conductive material having low resistance, such as aluminum (Al) or copper (Cu). However, since use of Al alone brings disadvantages such as low heat resistance and a tendency to be corroded, aluminum is used in combination with a conductive material having heat resistance. As the conductive material having heat resistance, any of the following materials may be used: an element selected from titanium (Ti), tantalum (Ta), tungsten (W), molybdenum (Mo), chromium (Cr), and neodymium (Nd), scandium (Sc), an alloy containing any of these above elements as a component, an alloy containing these elements in combination, and a nitride containing any of these above elements as a component.

Next, a gate insulating layer 102 is formed over the entire surface of the gate electrode layer 101. The gate insulating layer 102 is formed to a thickness of 50 to 250 nm by a sputtering method or the like.

For example, for the gate insulating layer 102, a 100-nm-thick silicon oxide film is formed by a sputtering method. Needless to say, the gate insulating layer 102 is not limited to such a film and may be a single layer or a stack of any other types of insulating films such as a silicon oxynitride film, a silicon nitride film, an aluminum oxide film, and a tantalum oxide film.

Note that preferably, before the formation of the oxide semiconductor film, dust attached to a surface of the gate insulating layer is removed by reverse sputtering in which an argon gas is introduced to generate plasma. Note that instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

Next, a first oxide semiconductor film (in Embodiment 4, a first In—Ga—Zn—O-based non-single-crystal film) is formed over the gate insulating layer 102. Formation of the first In—Ga—Zn—O-based non-single-crystal film without exposure to air after the plasma treatment is effective in preventing dust and moisture from attaching to the interface between the gate insulating layer and the semiconductor film. Here, the first In—Ga—Zn—O-based non-single-crystal film is formed in an argon or oxygen atmosphere using an oxide semiconductor target having a diameter of 8 inches and containing In, Ga, and Zn (the ratio of $In_2O_3$ to $Ga_2O_3$ and ZnO is 1:1:1), with the distance between the substrate and the target set to 170 mm, under a pressure of 0.4 Pa, and with a direct-current (DC) power source of 0.5 kW. Note that it is preferable to use a pulsed direct-current (DC) power source with which dust can be reduced and thickness distribution can be evened. The first In—Ga—Zn—O-based non-single-crystal film has a thickness of 5 to 200 nm. In Embodiment 4, the thickness of the first In—Ga—Zn—O-based non-single-crystal film is 100 nm.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a channel protective layer 133 is formed in a region overlapped with a channel formation region of the first In—Ga—Zn—O-based non-single-crystal film. The channel protective layer 133 may also be formed successively after the first In—Ga—Zn—O-based non-single-crystal film is formed, without exposure to air. By successive formation of the thin films stacked without exposure to air, productivity can be improved.

The channel protective layer 133 can be formed from an inorganic material (e.g., silicon oxide, silicon nitride, silicon oxynitride, or silicon nitride oxide). As a manufacturing method, a vapor phase growth method such as a plasma CVD method or a thermal CVD method, or a sputtering method can be used. After the formation of the channel protective layer 133, the shape thereof is processed by etching. Here, the channel protective layer 133 is formed in such a manner that a silicon oxide film is formed by a sputtering method and processed by etching using a mask formed by photolithography.

Next, over the first In—Ga—Zn—O-based non-single-crystal film and the channel protective layer 133, a second oxide semiconductor film (in Embodiment 4, a second In—Ga—Zn—O-based non-single-crystal film) is formed by a sputtering method. Here, sputtering is performed using a target in which the ratio of $In_2O_3$ to $Ga_2O_3$ and ZnO is 1:1:1 under deposition conditions where the pressure is 0.4 Pa, the power is 500 W, the deposition temperature is room temperature, and an argon gas is introduced at a flow rate of 40 sccm. Despite the intentional use of the target in which the ratio of $In_2O_3$ to $Ga_2O_3$ and ZnO is 1:1:1, an In—Ga—Zn—O-based non-single-crystal film including crystal grains with a size of 1 to 10 nm immediately after the film formation may be formed. Note that it can be said that the presence or absence of crystal grains or the density of crystal grains can be adjusted and the diameter size can be adjusted within the range of 1 to 10 nm by appropriate adjustment of the composition ratio in the target, the film deposition pressure (0.1 to 2.0 Pa), the power (250 to 3000 W: 8 inches ø), the temperature (room temperature to 100° C.), the reactive sputtering deposition conditions, or the like. The second In—Ga—Zn—O-based non-single-crystal film has a thickness of 5 to 20 nm. Needless to say, when the film includes crystal grains, the size of the crystal grains does not exceed the thickness of the film. In Embodiment 4, the thickness of the second In—Ga—Zn—O-based non-single-crystal film is 5 nm.

The first In—Ga—Zn—O-based non-single-crystal film is formed under deposition conditions different from deposition conditions for the second In—Ga—Zn—O-based non-single-crystal film. For example, the first In—Ga—Zn—O-based non-single-crystal film is formed under conditions where the ratio of an oxygen gas flow rate to argon gas flow rate is higher than the ratio of an oxygen gas flow rate to an argon gas flow rate under the deposition conditions for the second In—Ga—Zn—O-based non-single-crystal film. Specifically, the second In—Ga—Zn—O-based non-single-crystal film is formed in a rare gas (e.g., argon or helium) atmosphere (or an atmosphere, less than or equal to 10% of which is an oxygen gas and greater than or equal to 90% of which is an argon gas), and the first In—Ga—Zn—O-based non-single-crystal film is formed in an oxygen atmosphere (or an atmosphere in which the ratio of an argon gas flow rate to an oxygen gas flow rate is 1:1 or higher).

A chamber used for deposition of the second In—Ga—Zn—O-based non-single-crystal film may be the same or different from the chamber in which the reverse sputtering has been performed.

Figure 8:
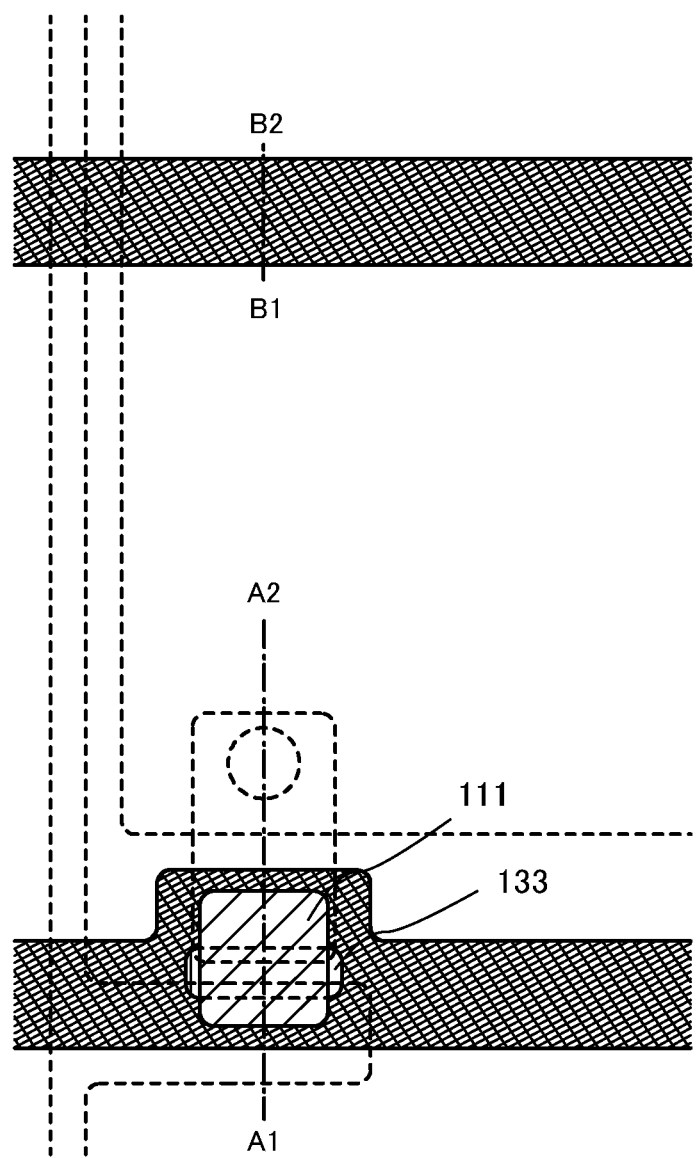
FIG. 8 illustrates a method for manufacturing a semiconductor device.

Next, a third photolithography step is performed to form a resist mask, and the first In—Ga—Zn—O-based non-single-crystal film and the second In—Ga—Zn—O-based non-single-crystal film are etched. Here, by wet etching using ITO-07N (manufactured by KANTO CHEMICAL CO., INC.), unnecessary portions are removed by etching, thereby forming an oxide semiconductor film 103 which is the first In—Ga—Zn—O-based non-single-crystal film and an oxide semiconductor film 111 which is the second In—Ga—Zn—O-based non-single-crystal film. Note that etching here is not limited to wet etching and may be dry etching. A cross-sectional view at this stage is illustrated in FIG. 5B. Note that a top view at this stage corresponds to FIG. 8.

Next, a fourth photolithography step is performed to form a resist mask, and unnecessary portions are removed by etching, thereby forming a contact hole that reaches the wiring or the electrode layer which is formed from the same material as the gate electrode layer. This contact hole is provided for direct contact with the conductive film formed later. For example, in the driving circuit, a contact hole is formed when a thin film transistor that is in direct contact with the gate electrode layer and the source or drain electrode layer or a terminal that is electrically connected to a gate wiring of a terminal portion is formed.

Next, over the oxide semiconductor film 103 and the oxide semiconductor film 111, a conductive film 132 formed from a metal material is formed by a sputtering method or a vacuum evaporation method. FIG. 5C is a cross-sectional view at this stage.

As the material of the conductive film 132, there are an element selected from Al, Cr, Ta, Ti, Mo, and W, an alloy containing any of these elements as a component, an alloy containing these elements in combination, and the like. Further, for heat treatment at 200 to 600° C., the conductive film preferably has heat resistance for such heat treatment. Since use of Al alone brings disadvantages such as low resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), and neodymium (Nd), scandium (Sc), an alloy containing any of these above elements as a component, an alloy containing these elements in combination, and a nitride containing any of these above elements as a component.

Here, the conductive film 132 has a single-layer structure of a titanium film. Alternatively, the conductive film 132 may have a two-layer structure: an aluminum film and a titanium film stacked thereon. Still alternatively, the conductive film 132 may have a three-layer structure: a Ti film, an aluminum film containing Nd (Al—Nd) which is stacked on the Ti film, and a Ti film formed on these films. The conductive film 132 may have a single-layer structure of an aluminum film containing silicon.

Figure 9:
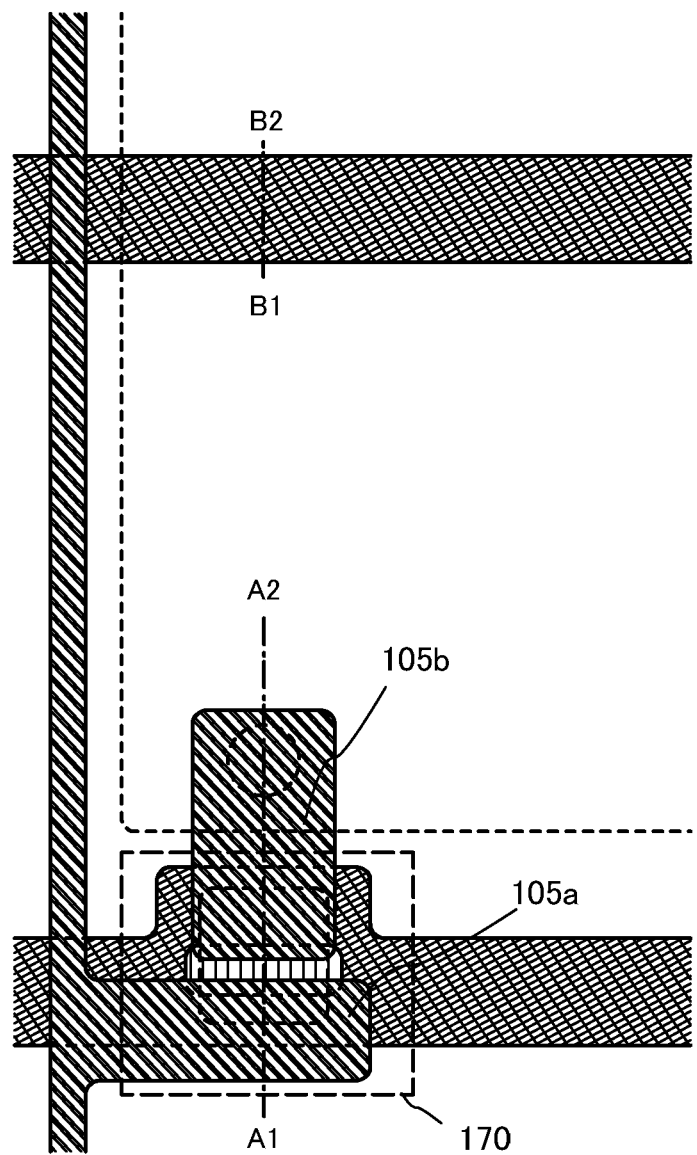
FIG. 9 illustrates a method for manufacturing a semiconductor device.

Next, a resist mask 131 is formed by a fifth photolithography step, and unnecessary portions are removed by etching, thereby forming source or drain electrode layers 105a and 105b and source or drain regions 104a and 104b. Wet etching or dry etching is used as an etching method at this time. For example, when an aluminum film or an aluminum-alloy film is used as the conductive film 132, wet etching using a mixed solution of phosphoric acid, acetic acid, and nitric acid can be carried out. Here, by wet etching using an ammonia hydrogen peroxide mixture (with the ratio of hydrogen peroxide to ammonia and water being 5:2:2), the conductive film 132 of a Ti film is etched to form the source or drain electrode layers 105a and 105b, and the oxide semiconductor film 111 is etched to form the source or drain regions 104a and 104b. In this etching step, the channel protective layer 133 functions as an etching stopper and thus is not etched. The etching for forming the source or drain electrode layers 105a and 105b and the source or drain regions 104a and 104b is performed at a time by using an etchant of an ammonia hydrogen peroxide mixture. Accordingly, in FIG. 6A, an end portion of the source or drain electrode layer 105a and an end portion of the source or drain electrode layer 105b are aligned with an end portion of the source or drain region 104a and an end portion of the source or drain region 104b, respectively; thus, continuous structures are formed. In addition, wet etching allows the layers to be etched isotropically, so that the end portions of the source or drain electrode layers 105a and 105b are recessed from the resist mask 131. Through the aforementioned steps, a thin film transistor 170 which includes the semiconductor layer 103 as a channel formation region and the channel protective layer 133 over the channel formation region can be manufactured. A cross-sectional view at this stage is illustrated in FIG. 6A. Note that FIG. 9 is a top view at this stage.

Because of the structure in which the channel protective layer 133 is provided over the channel formation region of the semiconductor layer 103, damage to the channel formation region of the semiconductor layer 103 (e.g., a reduction in thickness due to plasma or an etchant in etching, or oxidation) in the manufacturing process can be prevented. Therefore, reliability of the thin film transistor 170 can be improved.

Next, heat treatment is preferably performed at 200 to 600° C., typically, 300 to 500° C. Here, heat treatment is performed in a nitrogen atmosphere in a furnace at 350° C. for 1 hour. Through this heat treatment, rearrangement at the atomic level occurs in the In—Ga—Zn—O-based non-single-crystal film. Because strain energy which inhibits carrier movement is released by the heat treatment, the heat treatment (including optical annealing) is important. Note that there is no particular limitation on the timing of heat treatment as long as it is performed after formation of the second In—Ga—Zn—O-based non-single-crystal film, and for example, heat treatment may be performed after formation of a pixel electrode.

In the fifth photolithography step, a second terminal 122 made from the same material as the source or drain electrode layers 105a and 105b is also left in the terminal portion. Note that the second terminal 122 is electrically connected to a source wiring (a source wiring including the source or drain electrode layers 105a and 105b).

In addition, in the terminal portion, the connection electrode 120 is directly connected to the first terminal 121 of the terminal portion through a contact hole formed in the gate insulating film. Note that although not illustrated here, a source or drain wiring of the thin film transistor of the driver circuit is directly connected to the gate electrode through the same steps as the above-described steps.

Further, by use of a resist mask having regions with plural thicknesses (typically, two different thicknesses) which is formed using a multi-tone mask, the number of resist masks can be reduced, resulting in simplified process and lower costs.

Next, the resist mask 131 is removed, and a protective insulating layer 107 is formed to cover the thin film transistor 170. For the protective insulating layer 107, a silicon nitride film, a silicon oxide film, a silicon oxynitride film, an aluminum oxide film, a tantalum oxide film, or the like which is obtained by a sputtering method or the like can be used.

Then, a sixth photolithography step is performed to form a resist mask, and the protective insulating layer 107 is etched to form a contact hole 125 which reaches the drain electrode layer 105b. In addition, by the etching here, a contact hole 127 which reaches the second terminal 122 and a contact hole 126 which reaches the connection electrode 120 are preferably formed using the same resist mask. A cross-sectional view at this stage is illustrated in FIG. 6B.

Then, after the resist mask is removed, a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, because a residue tends to be generated particularly in etching of ITO, an alloy of indium oxide and zinc oxide ($In_2O_3$—ZnO) may be used in order to improve etching processability.

Next, a seventh photolithography step is performed to form a resist mask, and unnecessary portions are removed by etching, thereby forming a pixel electrode layer 110.

Further, in this seventh photolithography step, a storage capacitor is formed with the capacitor wiring 108 and the pixel electrode layer 110, in which the gate insulating layer 102 and the protective insulating layer 107 in the capacitor portion are used as a dielectric.

In addition, in this seventh photolithography step, the first terminal and the second terminal are covered with the resist mask, and transparent conductive films 128 and 129 are left in the terminal portion. The transparent conductive films 128 and 129 serve as electrodes or wirings that are used for connection with an FPC. The transparent conductive film 128 formed over the connection electrode 120 that is directly connected to the first terminal 121 serves as a terminal electrode for connection which functions as an input terminal for the gate wiring. The transparent conductive film 129 formed over the second terminal 122 serves as a terminal electrode for connection which functions as an input terminal for the source wiring.

Then, the resist mask is removed, and a cross-sectional view at this stage is illustrated in FIG. 6C. Note that a top view at this stage corresponds to FIG. 10.

Further, FIGS. 11A1 and 11A2 are a cross-sectional view of a gate wiring terminal portion at this stage and a top view thereof, respectively. FIG. 11A1 is a cross-sectional view taken along the line C1-C2 of FIG. 11A2. In FIG. 11A1, a transparent conductive film 155 formed over a protective insulating film 154 is a connection terminal electrode which functions as an input terminal. Furthermore, in FIG. 11A1, in the terminal portion, the first terminal 151 formed from the same material as the gate wiring and the connection electrode 153 formed from the same material as the source wiring are overlapped with each other through a contact hole provided in the gate insulating layer 152 so that the first terminal 151 and the connection electrode 153 are in direct contact with each other to form conduction therebetween. In addition, the connection electrode 153 and the transparent conductive film 155 are in direct contact with each other through a contact hole provided in the protective insulating film 154 to form conduction therebetween.

Further, FIGS. 11B1 and 11B2 are a cross-sectional view of a source wiring terminal portion at this stage and a top view thereof, respectively. In addition, FIG. 11B1 corresponds to a cross-sectional view taken along the line D1-D2 in FIG. 11B2. In FIG. 11B1, the transparent conductive film 155 formed over the protective insulating film 154 is a connection terminal electrode which functions as an input terminal. Furthermore, in FIG. 11B1, in the terminal portion, an electrode 156 formed from the same material as the gate wiring is located below and overlapped with the second terminal 150, which is electrically connected to the source wiring, with the gate insulating layer 152 interposed therebetween. The electrode 156 is not electrically connected to the second terminal 150. When the electrode 156 is set to, for example, floating, GND, or 0 V such that the potential the electrode 156 is different from the potential of the second terminal 150, a capacitor for preventing noise or static electricity can be formed. In addition, the second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

Through these seven photolithography steps, a pixel thin film transistor portion including the thin film transistor 170 which is a bottom-gate n-channel thin film transistor, and the storage capacitor can be completed using the seven photomasks. When these pixel thin film transistor portion and storage capacitor are arranged in a matrix corresponding to respective pixels, a pixel portion can be formed and one of the substrates for manufacturing an active matrix display device can be obtained. In this specification, such a substrate is referred to as an active matrix substrate for convenience.

When an active matrix liquid crystal display device is manufactured, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 10:
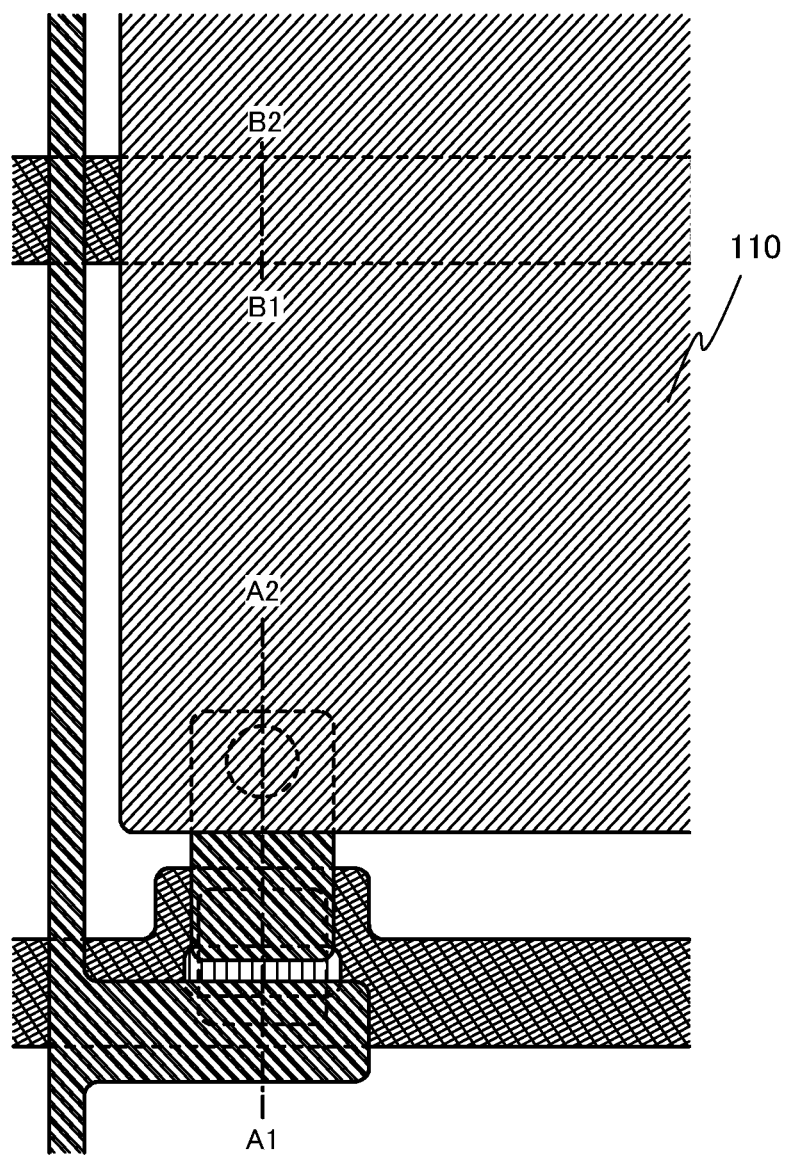
FIG. 10 illustrates a semiconductor device.
Figure 12:
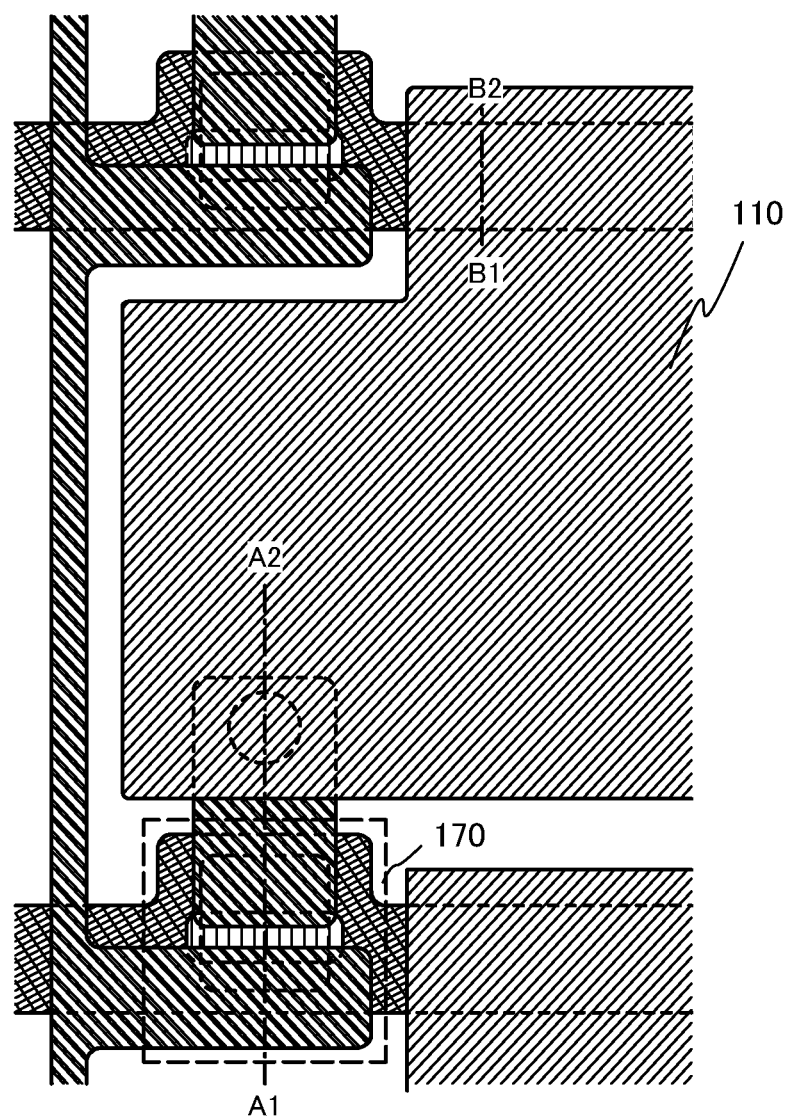
FIG. 12 illustrates a semiconductor device.

Further, an embodiment of the present invention is not limited to a pixel structure in FIG. 10, and an example of a top view different from FIG. 10 is illustrated in FIG. 12. FIG. 12 illustrates an example in which a capacitor wiring is not provided and a storage capacitor is formed with a pixel electrode layer and a gate wiring of an adjacent pixel which are overlapped with each other with a protective insulating film and a gate insulating layer interposed therebetween. In this case, the capacitor wiring and the third terminal connected to the capacitor wiring can be omitted. Note that in FIG. 12, portions similar to those in FIG. 10 are denoted by the same reference numerals.

In an active matrix liquid crystal display device, pixel electrodes arranged in a matrix are driven to form a display pattern on a screen. Specifically, a voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which the vertical cycle is 1.5 or 2 times as long as usual to improve the moving-image characteristics.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor obtained in Embodiment 4 includes an In—Ga—Zn—O-based non-single-crystal film in a channel formation region and has good dynamic characteristics. Thus, these driving methods can be applied in combination to the n-channel transistor of Embodiment 4.

When a light-emitting display device is manufactured, one electrode (also referred to as a cathode) of an organic light-emitting element is set to a low power supply potential such as GND or 0 V; therefore, a terminal portion is provided with a fourth terminal for setting the cathode to a low power supply potential such as GND or 0 V. In addition, when a light-emitting display device is manufactured, a power supply line is provided in addition to a source wiring and a gate wiring. Therefore, a terminal portion is provided with a fifth terminal electrically connected to the power supply line.

By use of thin film transistor in which an oxide semiconductor is used in a gate line driver circuit or a source line driver circuit, whereby manufacturing costs are reduced. Moreover, a gate electrode of the thin film transistor used for the driver circuit is directly connected to a source wiring or a drain wiring, whereby a display device in which the number of contact holes can be reduced and an area occupied by the driver circuit is reduced can be provided.

Therefore, according to an embodiment of the present invention, a display device having high electrical properties and high reliability can be provided at low costs.

Embodiment 5

Here, an example of a display device including a thin film transistor according to Embodiment 1 in which a wiring is in contact with a semiconductor layer will be described with reference to FIG. 30.

Figure 30:
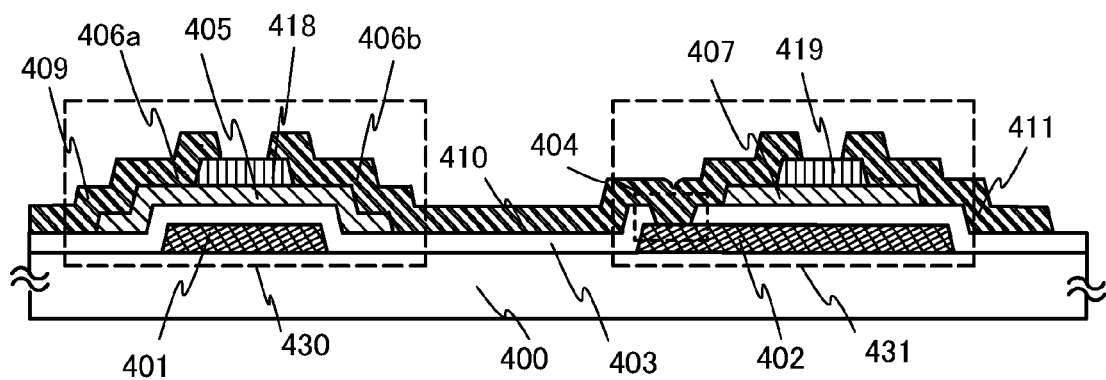
FIG. 30 illustrates a semiconductor device.

FIG. 30 illustrates a cross-sectional structure of an inverter circuit of a driver circuit. Note that a first thin film transistor 430 and a second thin film transistor 431 which are illustrated in FIG. 30 are each an inverted staggered thin film transistor having a channel protective layer. The first channel protective layer 418, the first wiring 409, and the second wiring 410 are provided in contact with the first oxide semiconductor layer 405, and the second channel protective layer 419, the second wiring 410, and the third wiring 411 are provided in contact with the second oxide semiconductor layer 407.

In the first thin film transistor 430 and the second thin film transistor 431, the following regions are preferably modified by plasma treatment: a region where the first oxide semiconductor layer 405 is in contact with the first wiring 409, a region where the first oxide semiconductor layer 405 is in contact with the second wiring 410, a region where the second oxide semiconductor layer 407 is in contact with the second wiring 410, and a region where the second oxide semiconductor layer 407 is in contact with the third wiring 411. In Embodiment 5, before a conductive film serving as wirings is formed, an oxide semiconductor layer (in Embodiment 5, an In—Ga—Zn—O-based non-single-crystal film) is subjected to plasma treatment in an argon atmosphere.

For the plasma treatment, instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

The conductive film is formed in contact with the first oxide semiconductor layer 405 and the second oxide semiconductor layer 407 which are modified by the plasma treatment, thereby forming the first wiring 409, the second wiring 410, and the third wiring 411. Accordingly, it is possible to reduce the contact resistance between the first oxide semiconductor layer 405 and the first wiring 409, the contact resistance between the first oxide semiconductor layer 405 and the second wiring 410, the contact resistance between the second oxide semiconductor layer 407 and the second wiring 410, and the contact resistance between the second oxide semiconductor layer 407 and the third wiring 411.

Through the above process, a highly reliable display device as a semiconductor device can be manufactured.

Embodiment 5 can be implemented in appropriate combination with the structures described in the other embodiments.

Embodiment 6

In Embodiment 6, an example will be described below, in which at least a part of a driver circuit and a thin film transistor arranged in a pixel portion are formed over the same substrate in a display device which is one example of a semiconductor device of the present invention.

The thin film transistor to be disposed in the pixel portion is formed according to Embodiment 4 or 5. Further, the thin film transistor described in Embodiment 4 or 5 is an n-channel TFT, and thus a part of a driver circuit that can include an n-channel TFT among driver circuits is formed over the same substrate as the thin film transistor of the pixel portion.

Figure 14A:
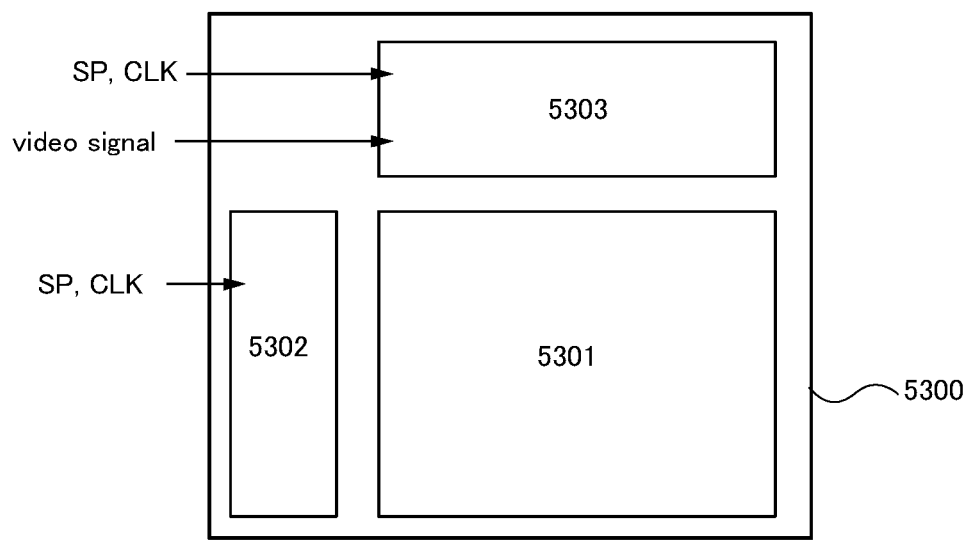
FIGS. 14A and 14B are block diagrams each illustrating a semiconductor device.

FIG. 14A exemplifies a block diagram of an active matrix liquid crystal display device which is an example of a semiconductor device of the present invention. The display device shown in FIG. 14A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not shown) which extend in a column direction from the signal line driver circuit 5303, and to the scan line driver circuit 5302 by a plurality of scan lines G1 to Gn (not shown) that extend in a row direction from the scan line driver circuit 5302. The pixel portion 5301 includes a plurality of pixels (not shown) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor described in Embodiment 4 or 5 is an n-channel TFT, and a signal line driver circuit including the n-channel TFT is described with reference to FIG. 15.

Figure 15:
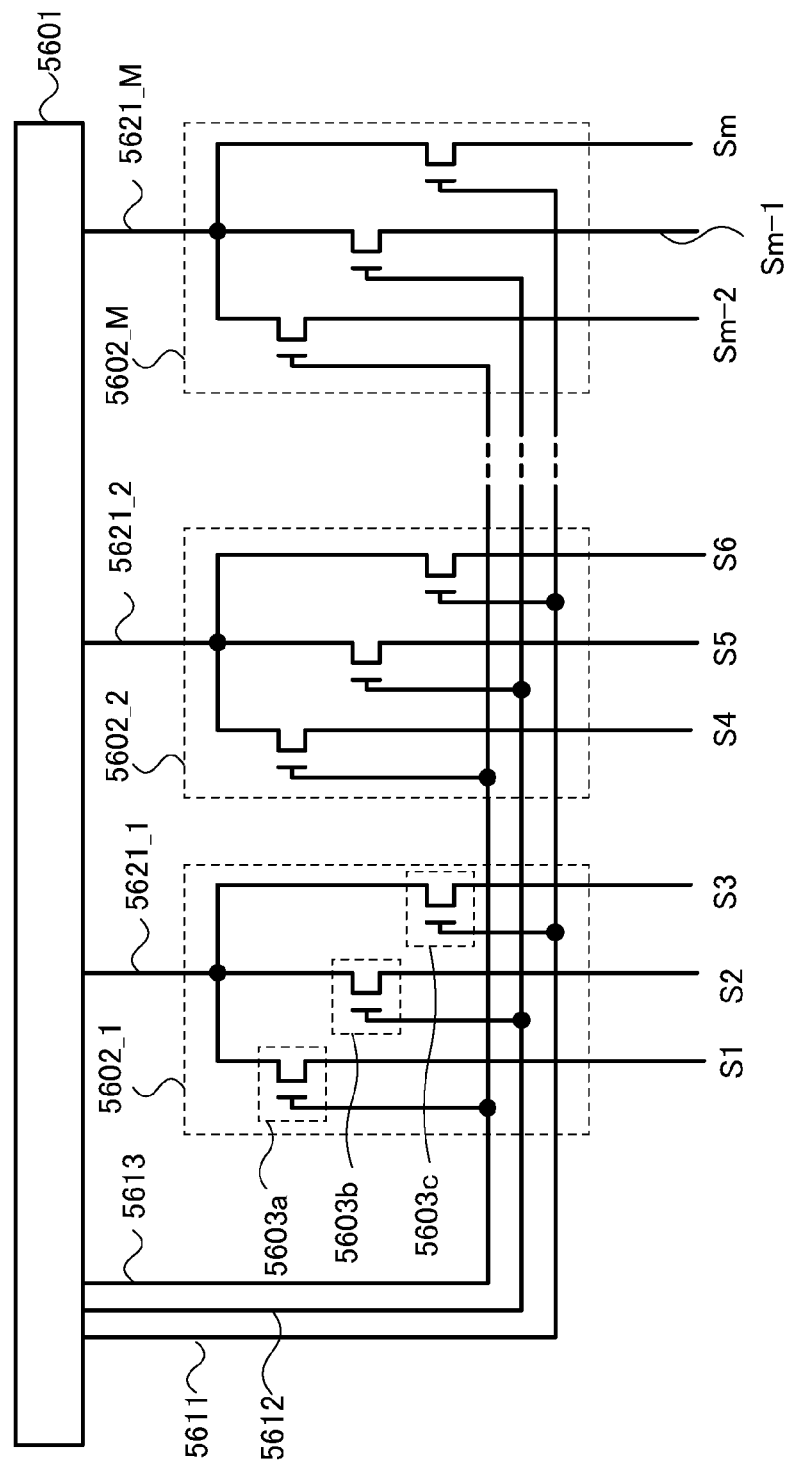
FIG. 15 illustrates a configuration of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed over a single crystalline substrate. Further, the switch groups 5602_1 to 5602_M are preferably formed over the same substrate as the pixel portion is. Therefore, the driver IC 5601 and the switch groups 5602_1 to 5602_M are preferably connected through an FPC or the like.

Figure 16:
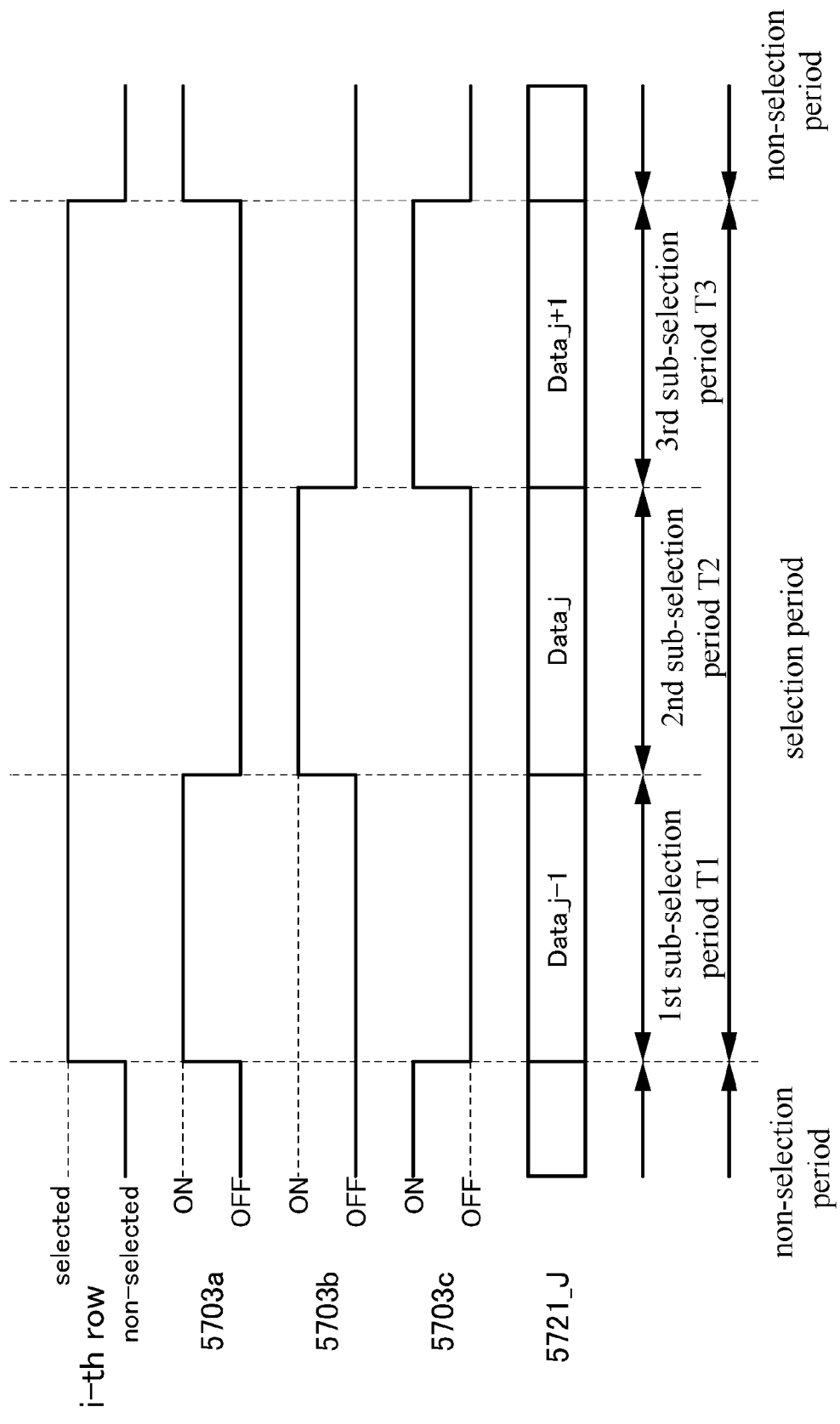
FIG. 16 is a timing chart illustrating operation of a signal line driver circuit.

Next, operation of the signal line driver circuit illustrated in FIG. 15 is described with reference to a timing chart in FIG. 16. The timing chart in FIG. 16 illustrates the case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 15 operates similarly to that in FIG. 16 even when a scan line of another row is selected.

Note that the timing chart in FIG. 16 shows the case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

Note that the timing chart in FIG. 16 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As shown in FIG. 16, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 15, by dividing one gate selection period into three, video signals can be input to three signal lines from one wiring 5621 in one gate selection period. Therefore, in the signal line driver circuit in FIG. 15, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 15 can be improved.

Note that there are no particular limitation on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 15.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 17:
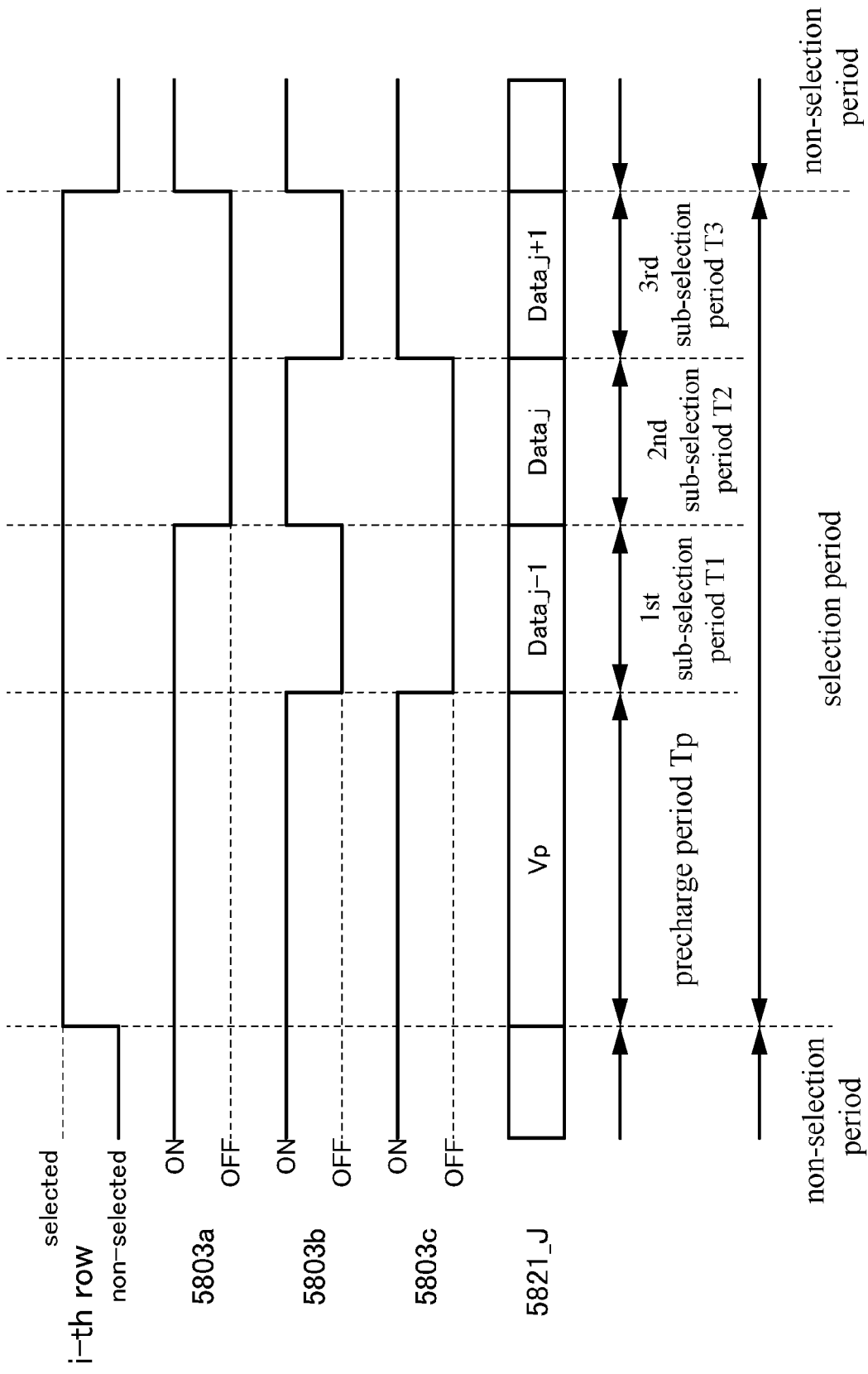
FIG. 17 is a timing chart illustrating operation of a signal line driver circuit.

As another example, one gate selection period may be divided into a precharge period Tp, the first sub-selection period T1, the second sub-selection period T2, and the third sub-selection period T3 as shown in a timing chart of FIG. 17. The timing chart of FIG. 17 shows the timing at which the scan line Gi of the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 5821_J input to the wiring 5621_J of the J-th column. As shown in FIG. 17, the first thin film transistor 5603a, the second thin film transistor 5603b, and the third thin film transistor 5603c are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit of FIG. 15 to which the timing chart of FIG. 17 is applied, the video signal can be written to the pixel at high speed because the signal line can be precharged by providing a precharge period before a sub-selection period. Note that portions of FIG. 17 which are similar to those of FIG. 16 are denoted by common reference numerals and detailed description of like portions and portions having a similar function is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register used for a part of the scan line driver circuit will be described with reference to FIG. 18 and FIG. 19.

Figure 18:
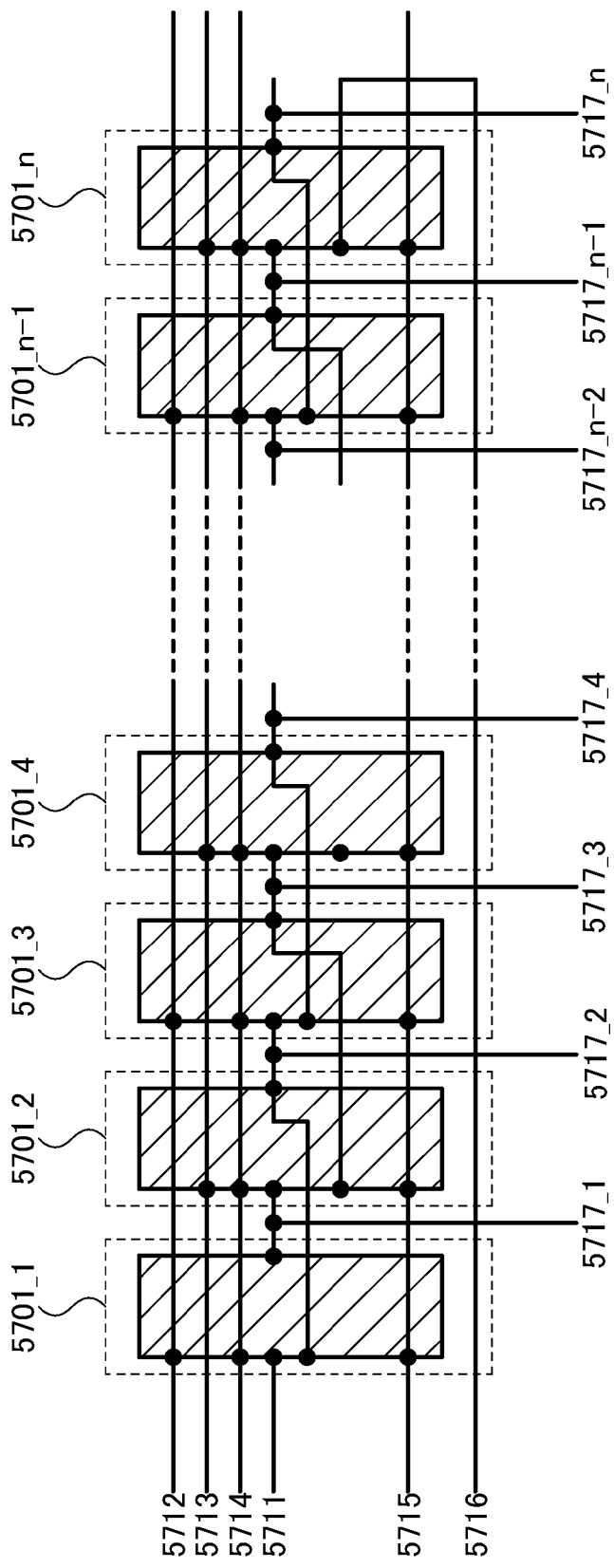
FIG. 18 illustrates a configuration of a shift register.

FIG. 18 illustrates a circuit configuration of the shift register. The shift register illustrated in FIG. 18 includes a plurality of flip-flops: flip-flops 5701_i to 5701_n. The shift register is operated with input of a first clock signal, a second clock signal, a start pulse signal, and a reset signal.

The connection relationship of the shift register of FIG. 18 will be described. In the i-th stage flip-flop 5701_i (one of the flip-flops 5701_1 to 5701_n) in the shift register of FIG. 18, a first wiring 5501 shown in FIG. 19 is connected to a seventh wiring 5717_i−1, a second wiring 5502 shown in FIG. 19 is connected to a seventh wiring 5717_i+1, a third wiring 5503 shown in FIG. 19 is connected to a seventh wiring 5717_i, and a sixth wiring 5506 shown in FIG. 19 is connected to a fifth wiring 5715.

Figure 19:
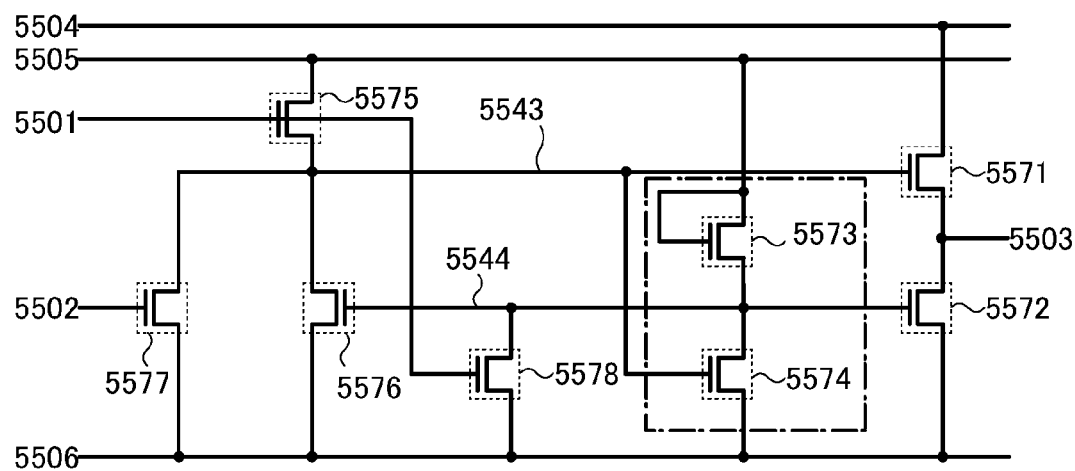
FIG. 19 illustrates a connection structure of the flip-flop illustrated in FIG. 18.

Further, a fourth wiring 5504 shown in FIG. 19 is connected to a second wiring 5712 in flip-flops of odd-numbered stages, and is connected to a third wiring 5713 in flip-flops of even-numbered stages. A fifth wiring 5505 shown in FIG. 19 is connected to a fourth wiring 5714.

Note that the first wiring 5501 of the first stage flip-flop 5701_-1 which is shown in FIG. 19 is connected to a first wiring 5711. Moreover, the second wiring 5502 of the n-th stage flip-flop 5701_n which is shown in FIG. 19 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 19 illustrates details of the flip-flop shown in FIG. 18. A flip-flop shown in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In FIG. 19, a gate electrode of the third thin film transistor 5573 is electrically connected to the power supply line. Further, it can be said that a circuit in which the third thin film transistor 5573 is connected to the fourth thin film transistor 5574 (a circuit surrounded by the chain line in FIG. 19) corresponds to a circuit having the configuration illustrated in FIG. 2A. Although the example in which all the thin film transistors are enhancement type n-channel transistors is described here, there is no limitation to this example. For example, the driver circuit can be driven even with the use of an n-channel depletion-mode transistor as the third thin film transistor 5573.

Next, connection structures of the flip-flop shown in FIG. 19 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in Embodiment 4. The n-channel TFT described in Embodiment 4 has a high mobility, and thus a driving frequency of a driver circuit can be increased. Further, parasitic capacitance is reduced by the source or drain region which is an In—Ga—Zn—O-based non-single-crystal film; thus, the n-channel TFT described in Embodiment 4 has high frequency characteristics (referred to as f characteristics). For example, a scan line driver circuit using the n-channel TFT described in Embodiment 4 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 14B:
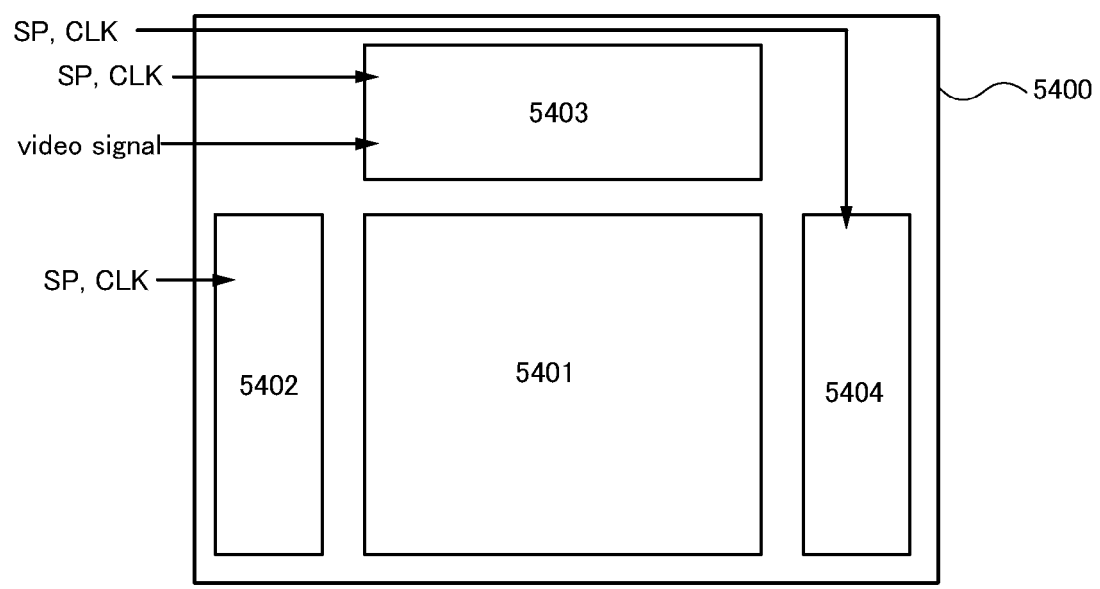

Further, when an active matrix light-emitting display device which is an example of a semiconductor device of the present invention is manufactured, a plurality of thin film transistors are arranged in at least one pixel, and thus a plurality of scan line driver circuits are preferably arranged. FIG. 14B illustrates an example of a block diagram of an active matrix light-emitting display device.

The display device shown in FIG. 14B includes, over a substrate 5400, a pixel portion 5401 including a plurality of pixels each provided with a display element, a first scan line driver circuit 5402 and a second scan line driver circuit 5404 for selecting a pixel, and a signal line driver circuit 5403 for controlling a video signal input to the selected pixel.

When the video signal input to a pixel of the light-emitting display device shown in FIG. 14B is a digital signal, a pixel emits light or does not emit light by switching a transistor on/off. Thus, grayscale can be displayed using an area grayscale method or a time grayscale method. An area grayscale method refers to a driving method in which one pixel is divided into a plurality of subpixels and the respective subpixels are driven independently based on video signals so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of subframe periods. Then, in accordance with video signals, the light-emitting element in the pixel is brought into a light-emitting state or a non-light-emitting state in each subframe period. By dividing one frame period into a plurality of subframe periods, the total length of time, in which a pixel actually emits light in one frame period, can be controlled by video signals so that grayscale can be displayed.

Note that in the example of the light-emitting display device shown in FIG. 14B, when two switching TFTs are arranged in one pixel, the first scan line driver circuit 5402 generates a signal which is input to a first scan line serving as a gate wiring of one of the two switching TFTs, and the second scan line driver circuit 5404 generates a signal which is input to a second scan line serving as a gate wiring of the other of the two switching TFTs; however, one scan line driver circuit may generate both the signal which is input to the first scan line and the signal which is input to the second scan line. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, a part of a driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in Embodiment 4 or 5.

Moreover, the above-described driver circuit can be used for an electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizer or a counter substrate, which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistors described in Embodiment 4 or 5 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Through the above process, a highly reliable display device as a semiconductor device can be manufactured.

Embodiment 6 can be implemented in appropriate combination with the structures described in the other embodiments.

Embodiment 7

When a thin film transistor of one embodiment of the present invention is manufactured and used for a pixel portion and further for a driver circuit, a semiconductor device having a display function (also referred to as a display device) can be manufactured. Furthermore, when a part or whole of a driver circuit using a thin film transistor of one embodiment of the present invention is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as an FPC (flexible printed circuit), a TAB (tape automated bonding) tape, or a TCP (tape carrier package) is attached; a module having a TAB tape or a TCP at the tip of which a printed wiring board is provided; and a module in which an IC (integrated circuit) is directly mounted on a display element by a COG (chip on glass) method.

In Embodiment 7, the appearance and a cross section of a liquid crystal display panel, which is one embodiment of a semiconductor device of the present invention, will be described with reference to FIGS. 22A1, 22A2 and 22B. FIGS. 22A1 and 22A2 are each a top view of a panel in which highly reliable thin film transistors 4010 and 4011 formed over a first substrate 4001 and a liquid crystal element 4013 are sealed between the first substrate 4001 and a second substrate 4006 with a sealant 4005. The thin film transistors 4010 and 4011 are according to Embodiment 4 and each include an In—Ga—Zn—O-based non-single-crystal film formed over a first substrate 4001 as a semiconductor layer. FIG. 22B is a cross-sectional view taken along the line M-N of FIGS. 22A1 and 22A2.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 22A1 illustrates an example of mounting the signal line driver circuit 4003 by a COG method, and FIG. 22A2 illustrates an example of mounting the signal line driver circuit 4003 by a TAB method.

The pixel portion 4002 and the scanning line driver circuit 4004 provided over the first substrate 4001 each include a plurality of thin film transistors. FIG. 22B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

As the thin film transistors 4010 and 4011, the thin film transistor including an In—Ga—Zn—O-based non-single-crystal film as a semiconductor layer which is described in Embodiment 4 can be employed. Alternatively, the thin film transistor described in Embodiment 5 may be employed. In Embodiment 7, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, an FRP (fiberglass-reinforced plastics) plate, a PVF (polyvinyl fluoride) film, a polyester film, or an acrylic resin film can be used. Alternatively, a sheet with a structure in which an aluminum foil is sandwiched between PVF films or polyester films can be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal showing a blue phase and a chiral agent has a small response time of 10 to 100 μs, has optical isotropy, which makes the alignment process unneeded, and has a small viewing angle dependence.

Although an example of a transmissive liquid crystal display device is described in Embodiment 7, an embodiment of the present invention can also be applied to a reflective liquid crystal display device or a transflective liquid crystal display device.

In Embodiment 7, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stack structure of the polarizing plate and the coloring layer is not limited to that described in Embodiment 7 and may be set as appropriate depending on materials of the polarizing plate and the coloring layer or conditions of manufacturing steps. Furthermore, a light-blocking film serving as a black matrix may be provided.

In Embodiment 7, in order to reduce the surface roughness of the thin film transistor and to improve the reliability of the thin film transistor, the thin film transistor obtained by Embodiment 4 is covered with the insulating layers (the insulating layer 4020 and the insulating layer 4021) serving as a protective film or a planarizing insulating film. Note that the protective film is provided to prevent entry of impurities floating in air, such as an organic substance, a metal substance, or moisture, and is preferably a dense film. The protective film may be formed by a sputtering method to be a single-layer film or a stack of a silicon oxide film, a silicon nitride film, a silicon oxynitride film, a silicon nitride oxide film, an aluminum oxide film, an aluminum nitride film, an aluminum oxynitride film, and/or an aluminum nitride oxide film. Although an example in which the protective film is formed by a sputtering method is described in Embodiment 7, the present invention is not limited to this method and a variety of methods may be employed.

Here, the insulating layer 4020 having a stack structure is formed as the protective film. As a first layer of the insulating layer 4020, a silicon oxide film is formed by a sputtering method. The use of the silicon oxide film as the protective film has the effect of preventing a hillock of an aluminum film used for the source and drain electrode layers.

The insulating layer is also formed as a second layer of the protective film. In Embodiment 7, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electrical properties of the TFT.

After the protective film is formed, the semiconductor layer may be subjected to annealing (300 to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane resin is a resin formed from a siloxane material as a starting material and having a Si—O—Si bond. As a substituent, an organic group (e.g., an alkyl group or an aryl group) or a fluoro group may be used. The organic group may include a fluoro group.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (e.g., an inkjet method, screen printing, offset printing, or the like), a doctor knife, a roll coater, a curtain coater, a knife coater, or the like. In the case where the insulating layer 4021 is formed using a material solution, the semiconductor layer may be annealed (at 300 to 400° C.) at the same time of a baking step. The baking step of the insulating layer 4021 also serves as the annealing step of the semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied to the signal line driver circuit 4003 that is formed separately, and the scanning line driver circuit 4004 or the pixel portion 4002 from an FPC 4018.

In Embodiment 7, a connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 22A1, 22A2 and 22B illustrate an example in which the signal line driver circuit 4003 is formed separately and mounted on the first substrate 4001; however, Embodiment 7 is not limited to this structure. The scanning line driver circuit may be separately formed and then mounted, or only a part of the signal line driver circuit or a part of the scanning line driver circuit may be separately formed and then mounted.

Figure 23:
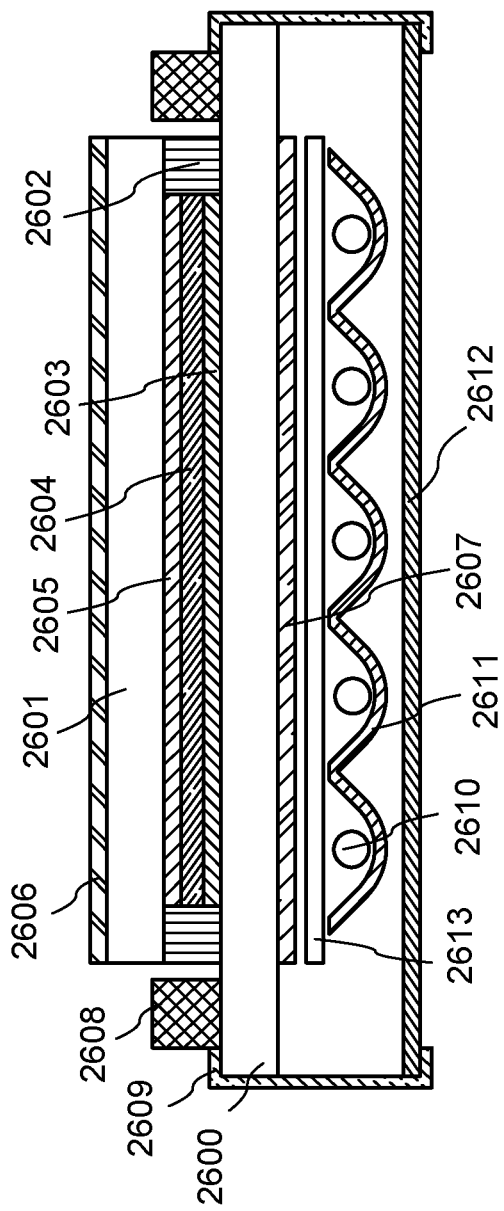
FIG. 23 illustrates a semiconductor device.

FIG. 23 illustrates an example of a liquid crystal display module which is formed as a semiconductor device by using a TFT substrate 2600 manufactured according to an embodiment of the present invention.

FIG. 23 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display panel as a semiconductor device can be manufactured.

Embodiment 7 can be implemented in appropriate combination with the structures described in the other embodiments.

Embodiment 8

In Embodiment 8, an example of an electronic paper will be described as a semiconductor device of an embodiment of the present invention.

Figure 13:
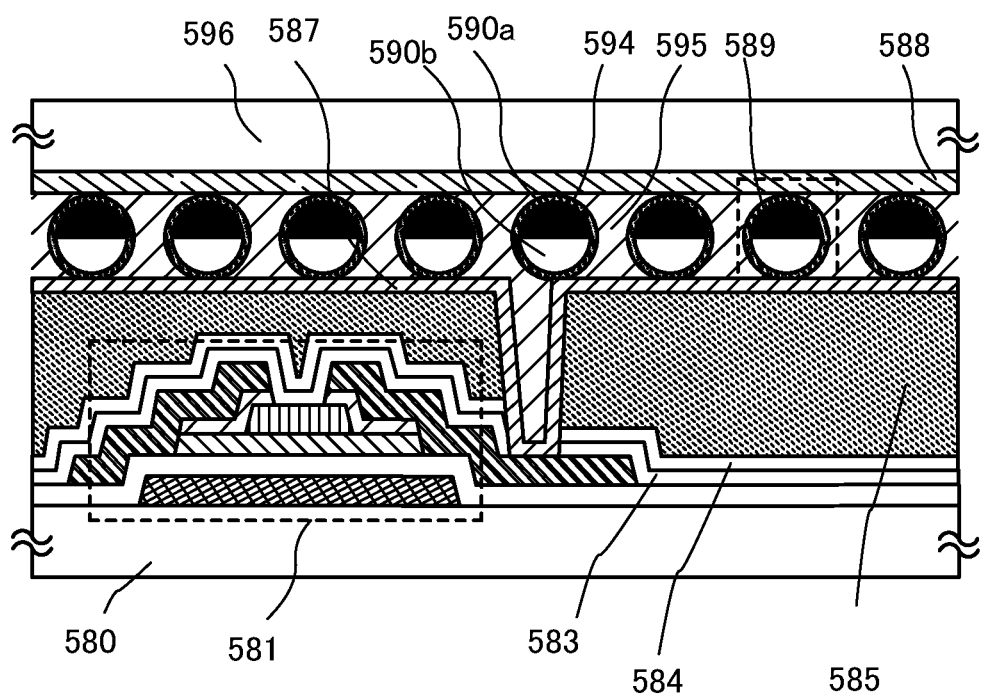
FIG. 13 illustrates a semiconductor device.

FIG. 13 illustrates an active matrix electronic paper as an example of a semiconductor device to which an embodiment of the present invention is applied. A thin film transistor 581 used for the semiconductor device can be manufactured in a manner similar to that of the thin film transistor described in Embodiment 4 and is a highly reliable thin film transistor including an In—Ga—Zn—O-based non-single-crystal film as a semiconductor layer. The thin film transistor described in Embodiment 5 can also be used as the thin film transistor 581 of Embodiment 8.

The electronic paper in FIG. 13 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor with a bottom gate structure, and a source or drain electrode layer thereof is in contact with a first electrode layer 587 through an opening formed in insulating layer 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (see FIG. 13). In Embodiment 8, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Instead of the twisting ball, an electrophoretic element can also be used. A microcapsule having a diameter of about 10 to 200 µm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

Embodiment 8 can be implemented in appropriate combination with the structures described in the other embodiments.

Embodiment 9

In Embodiment 9, an example of a light-emitting display device will be described as a semiconductor device of one embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 20:
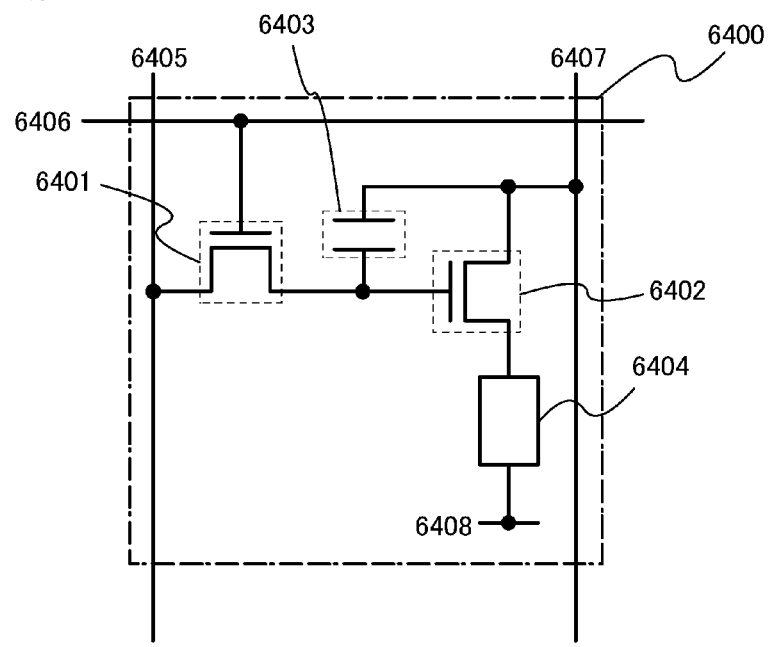
FIG. 20 illustrates a pixel equivalent circuit of a semiconductor device.

FIG. 20 illustrates an example of a pixel structure as an example of a semiconductor device according to an embodiment of the present invention, which can be driven by a digital time grayscale method.

The structure and operation of a pixel which can be driven by a digital time grayscale method will be described. An example is described here in which one pixel includes two n-channel transistors using an oxide semiconductor layer (an In—Ga—Zn—O-based non-single-crystal film) in a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the structure illustrated in FIG. 1A, FIG. 2A, or FIG. 3A may be obtained using the connection portion as a common connection portion.

Note that the second electrode (common electrode 6408) of the light-emitting element 6404 is set to a low power supply potential. The low power supply potential is lower than a high power supply potential which is supplied to the power supply line 6407. For example, GND or 0 V may be set as the low power supply potential. The difference between the high power supply potential and the low power supply potential is applied to the light-emitting element 6404 so that a current flows through the light-emitting element 6404, whereby the light-emitting element 6404 emits light. Thus, each potential is set so that the difference between the high power supply potential and the low power supply potential is greater than or equal to a forward threshold voltage.

When the gate capacitance of the driving transistor 6402 is used as a substitute for the capacitor 6403, the capacitor 6403 can be omitted. The gate capacitance of the driving transistor 6402 may be formed between a channel region and a gate electrode.

Here, in the case of using a voltage-input voltage driving method, a video signal is input to the gate of the driving transistor 6402 to make the driving transistor 6402 completely turn on or off. That is, the driving transistor 6402 operates in a linear region, and thus, a voltage higher than the voltage of the power supply line 6407 is applied to the gate of the driving transistor 6402. Note that a voltage greater than or equal to (power supply line voltage+$V_{th}$ of the driving transistor 6402) is applied to the signal line 6405.

In the case of using an analog grayscale method instead of the digital time grayscale method, the same pixel structure as in FIG. 20 can be employed by inputting signals in a different way.

In the case of using the analog grayscale method, a voltage greater than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to enable the driving transistor 6402 to operate in a saturation region, a current can be supplied to the light-emitting element 6404. In order that the driving transistor 6402 can operate in the saturation region, the potential of the power supply line 6407 is higher than a gate potential of the driving transistor 6402. Since the video signal is an analog signal, a current in accordance with the video signal flows in the light-emitting element 6404, and the analog grayscale method can be performed.

Note that the pixel structure is not limited to that illustrated in FIG. 20. For example, the pixel in FIG. 20 can further include a switch, a resistor, a capacitor, a transistor, a logic circuit, or the like.

Next, structures of the light-emitting element will be described with reference to FIGS. 21A to 21C. Here, a cross-sectional structure of a pixel will be described by taking an n-channel driving TFT as an example. Driving TFTs 7001, 7011, and 7021 used for semiconductor devices illustrated in FIGS. 21A to 21C can be manufactured in a manner similar to that of the thin film transistor described in Embodiment 4 and are highly reliable thin film transistors each including an In—Ga—Zn—O-based non-single-crystal film as a semiconductor layer. Alternatively, the thin film transistor described in Embodiment 5 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure of an embodiment of the present invention can be applied to a light-emitting element having any of these emission structures.

A light-emitting element having a top emission structure will be described with reference to FIG. 21A.

Figure 21A:
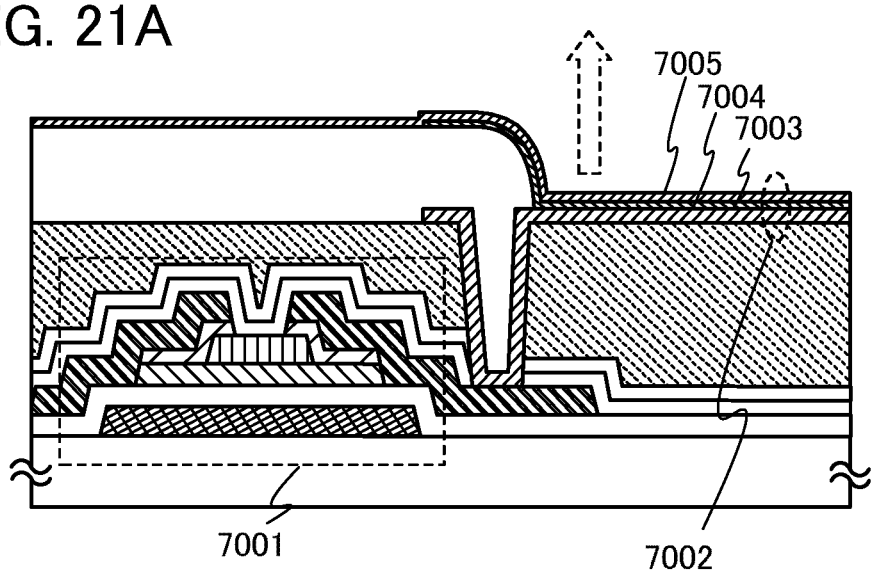
FIGS. 21A to 21C illustrate a semiconductor device.

FIG. 21A is a cross-sectional view of a pixel in the case where the driving TFT 7001 is of an n-type and light is emitted from a light-emitting element 7002 to an anode 7005 side. In FIG. 21A, a cathode 7003 of the light-emitting element 7002 is electrically connected to the driving TFT 7001, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, AlLi, or the like is preferably used. The light-emitting layer 7004 may be formed as a single layer or a plurality of layers stacked. When the light-emitting layer 7004 is formed as a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 21A, light is emitted from the light-emitting element 7002 to the anode 7005 side as indicated by an arrow.

Next, a light-emitting element having a bottom emission structure will be described with reference to FIG. 21B. FIG. 21B is a cross-sectional view of a pixel in the case where the driving TFT 7011 is of an n-type and light is emitted from a light-emitting element 7012 to a cathode 7013 side. In FIG. 21B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. Note that a light-blocking film 7016 for reflecting or blocking light may be formed to cover the anode 7015 when the anode 7015 has a light-transmitting property. For the cathode 7013, various materials can be used, like in the case of FIG. 21A, as long as they are conductive materials having a low work function. Note that the cathode 7013 is formed to have a thickness that can transmit light (preferably, approximately 5 to 30 nm). For example, an aluminum film with a thickness of 20 nm can be used as the cathode 7013. Similarly to the case of FIG. 21A, the light-emitting layer 7014 may be formed using either a single layer or a plurality of layers stacked. The anode 7015 is not required to transmit light, but can be made of a light-transmitting conductive material like in the case of FIG. 21A. As the light-blocking film 7016, a metal which reflects light can be used for example; however, it is not limited to a metal film. For example, a resin to which black pigments are added can also be used.

The light-emitting element 7012 corresponds to a region where the light-emitting layer 7014 is sandwiched between the cathode 7013 and the anode 7015. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 21A, the cathode 7023 can be made of a variety of conductive materials as long as they have a low work function. Note that the cathode 7023 is formed to have a thickness that can transmit light. For example, a 20-nm-thick Al film can be used as the cathode 7023. Like in FIG. 21A, the light-emitting layer 7024 may be formed as either a single layer or a plurality of layers stacked. The anode 7025 can be made of a light-transmitting conductive material like in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

In Embodiment 9, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 21B:
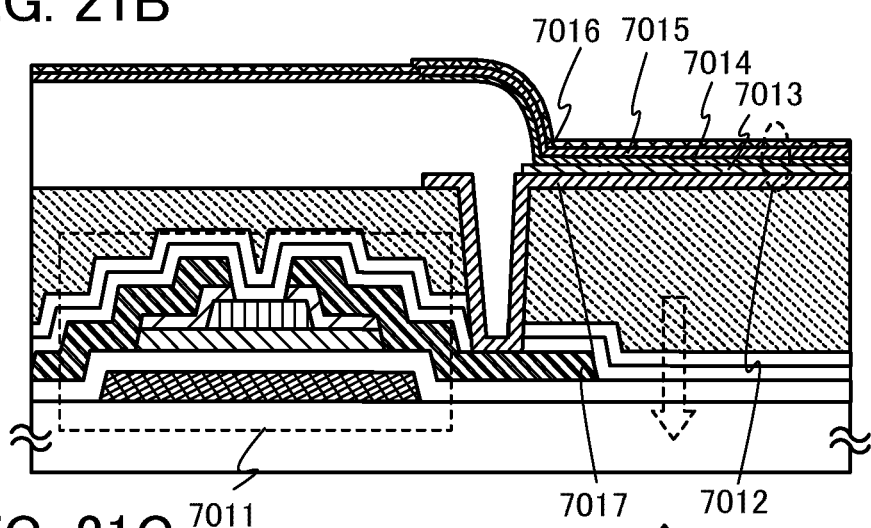
Figure 21C:
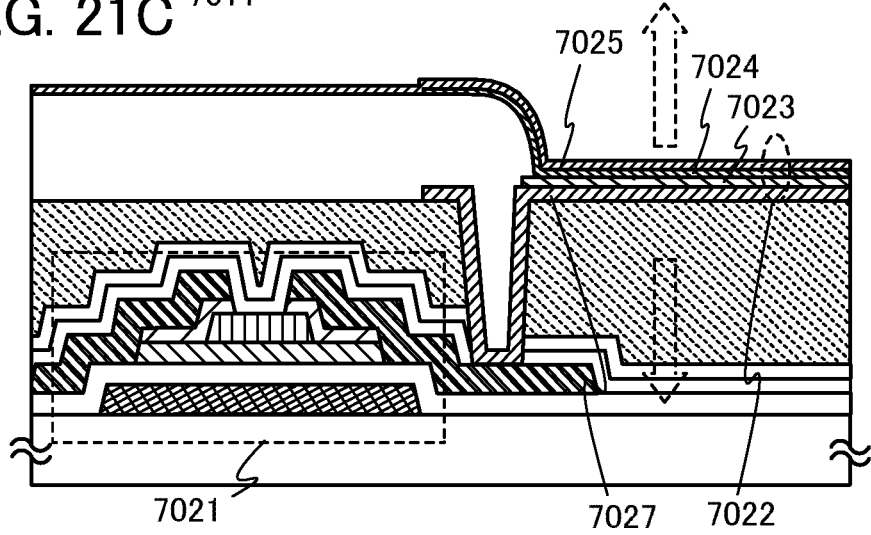

Note that the structure of the semiconductor device described in Embodiment 9 is not limited to those illustrated in FIGS. 21A to 21C and can be modified in various ways based on the spirit of techniques of the present invention.

Next, the appearance and a cross section of a light-emitting display panel (also referred to as a light-emitting panel), which is one embodiment of the semiconductor device of the present invention, will be described with reference to FIGS. 24A and 24B. FIG. 24A is a top view of a panel in which a thin film transistor and a light-emitting element are sealed between a first substrate and a second substrate with a sealant. FIG. 24B is a cross-sectional view taken along the line H-I of FIG. 24A.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 24B.

As the thin film transistors 4509 and 4510, the thin film transistor including an In—Ga—Zn—O-based non-single-crystal film as a semiconductor layer which is described in Embodiment 4 can be employed. Alternatively, the thin film transistor described in Embodiment 5 can be employed. In Embodiment 9, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stack structure described in Embodiment 9, which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the partition wall 4520 in order to prevent oxygen, hydrogen, moisture, carbon dioxide, or the like from entering into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scanning line driver circuits 4504a and 4504b, or the pixel portion 4502 from FPCs 4518a and 4518b.

In Embodiment 9, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In Embodiment 9, nitrogen is used for the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. Embodiment 9 is not limited to the structure illustrated in FIGS. 24A and 24B.

Through the above process, a highly reliable light-emitting display device (display panel) as a semiconductor device can be manufactured.

Embodiment 9 can be implemented in appropriate combination with the structures described in the other embodiments.

Embodiment 10

A semiconductor device of one embodiment of the present invention can be applied to an electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. Examples of the electronic appliances are illustrated in FIGS. 25A and 25B and FIG. 26.

Figure 25A:
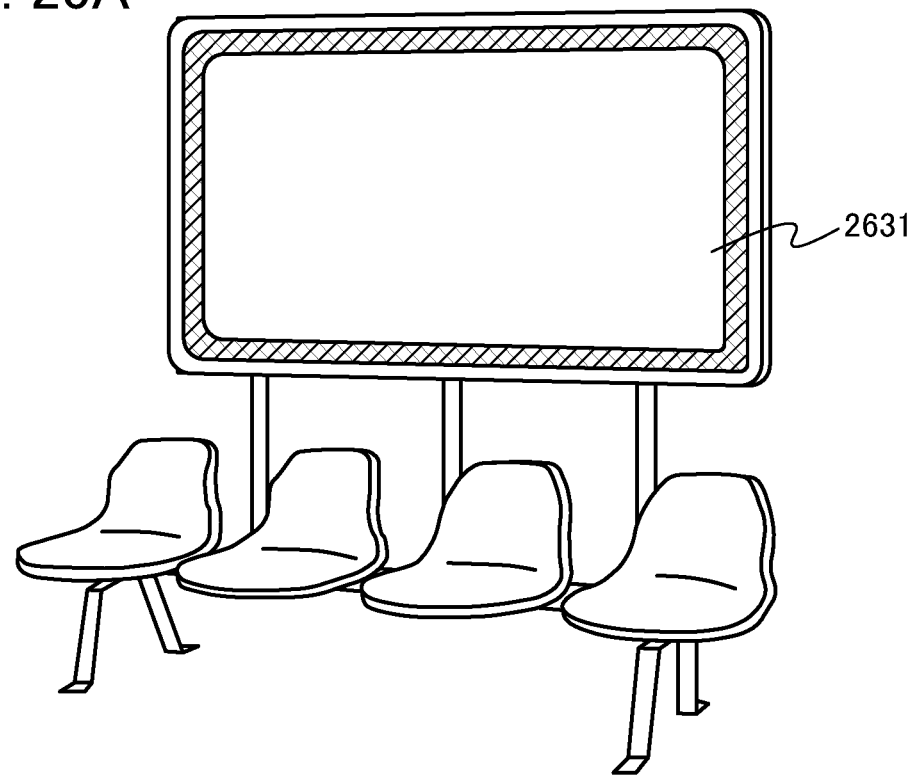
FIGS. 25A and 25B each illustrate an example of a usage pattern of an electronic paper.

FIG. 25A illustrates a poster 2631 using an electronic paper. In the case where an advertising medium is printed paper, the advertisement is replaced by hands; however, by using an electronic paper to which an embodiment of the present invention is applied, the advertising display can be changed in a short time. Furthermore, stable images can be obtained without display defects. Note that the poster may have a configuration capable of wirelessly transmitting and receiving data.

Figure 25B:
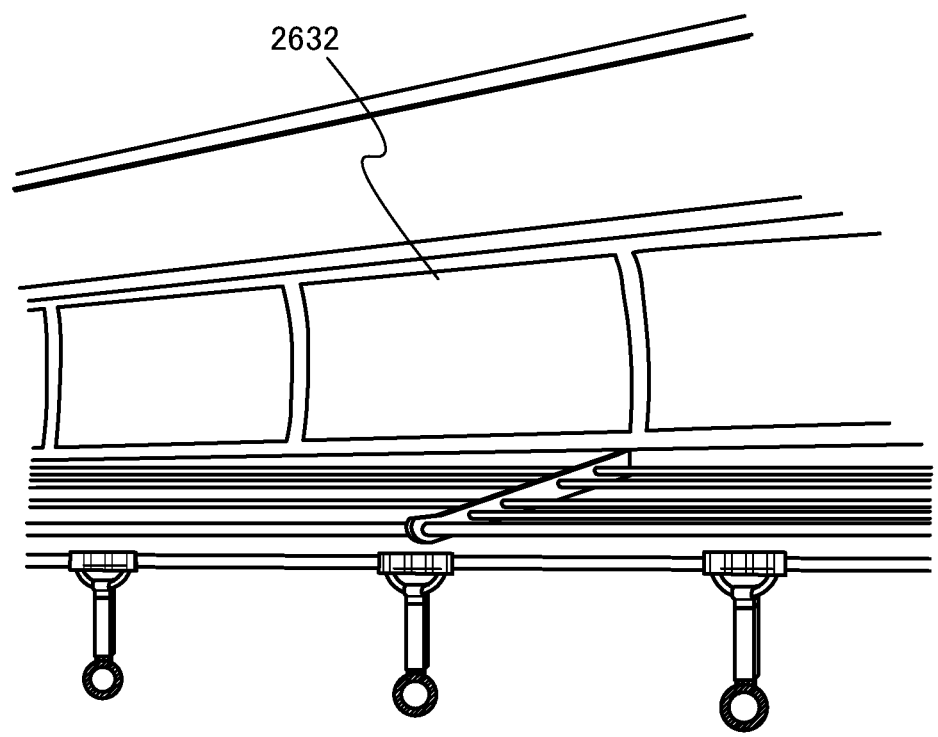

FIG. 25B illustrates an advertisement 2632 in a vehicle such as a train. In the case where an advertising medium is printed paper, the advertisement is replaced by hands; however, by using an electronic paper to which an embodiment of the present invention is applied, the advertising display can be changed in a short time with less manpower. Furthermore, stable images can be obtained without display defects. Note that the advertisement in a vehicle may have a configuration capable of wirelessly transmitting and receiving data.

Figure 26:
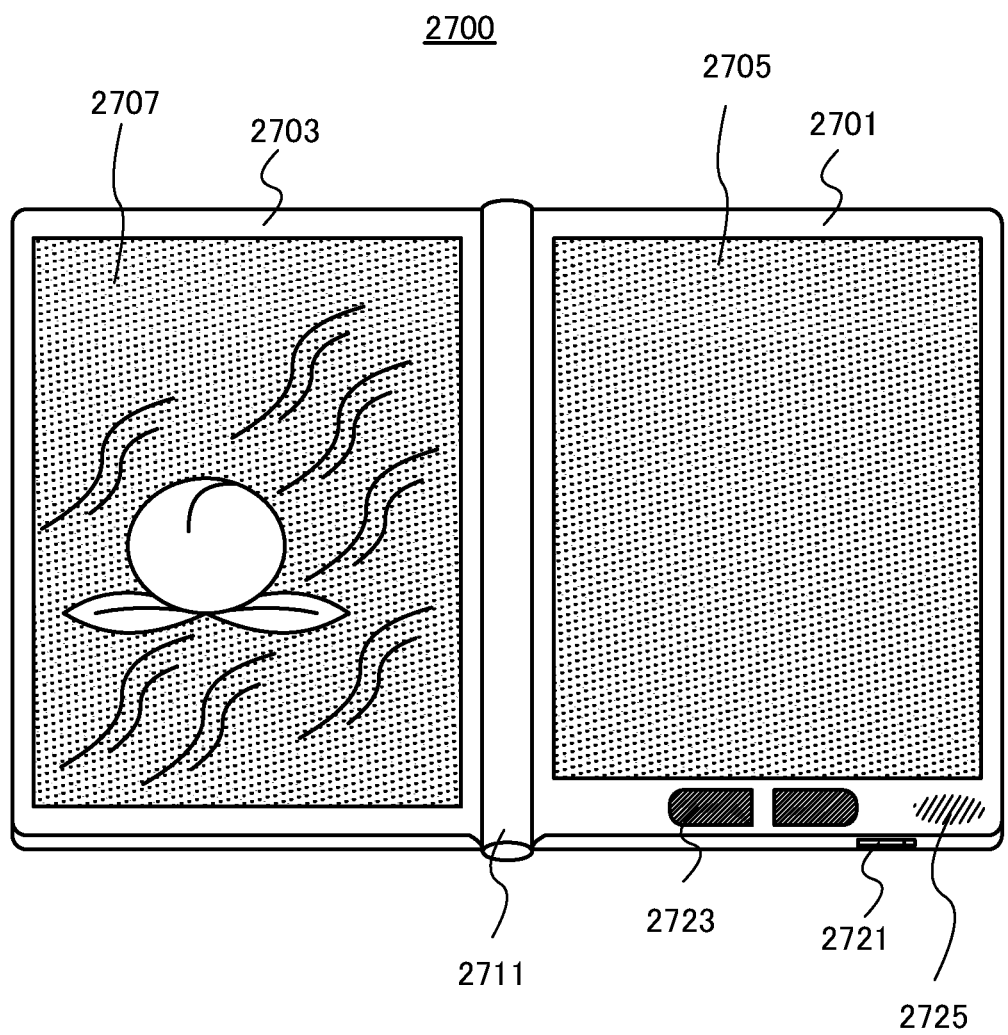
FIG. 26 is an external view of an example of an electronic book reader.

FIG. 26 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 26) and graphics can be displayed on a display portion on the left side (the display portion 2707 in FIG. 26).

FIG. 26 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 11

A semiconductor device of an embodiment of the present invention can be applied to a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 27A:
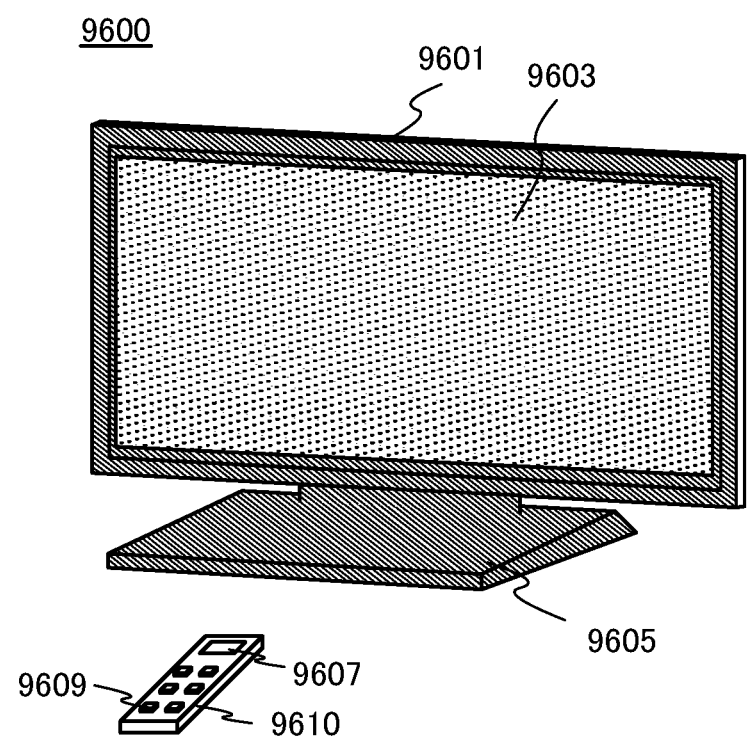
FIG. 27A is an external view of an example of a television device and FIG. 27B is an external view of an example of a digital photo frame.

FIG. 27A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 27B:
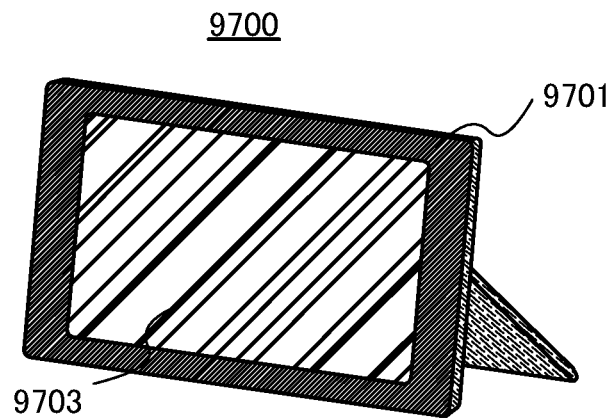

FIG. 27B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 28A:
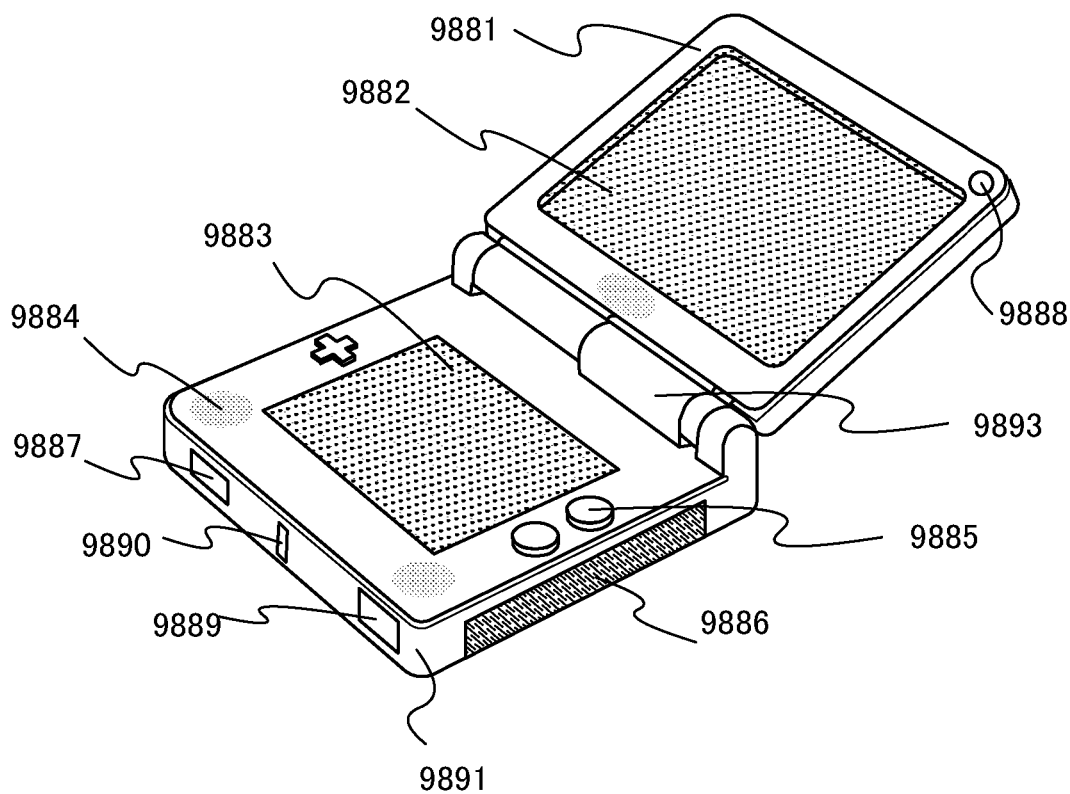
FIGS. 28A and 28B each illustrate an example of an amusement machine.

FIG. 28A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 28A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device of an embodiment of the present invention can be employed. The portable amusement machine may include other accessory equipment as appropriate. The portable amusement machine illustrated in FIG. 28A has a function of reading a program or data stored in a recording medium to display it on the display portion, and a function of sharing information with another portable amusement machine by wireless communication. The portable amusement machine illustrated in FIG. 28A can have various functions without limitation to the above.

Figure 28B:
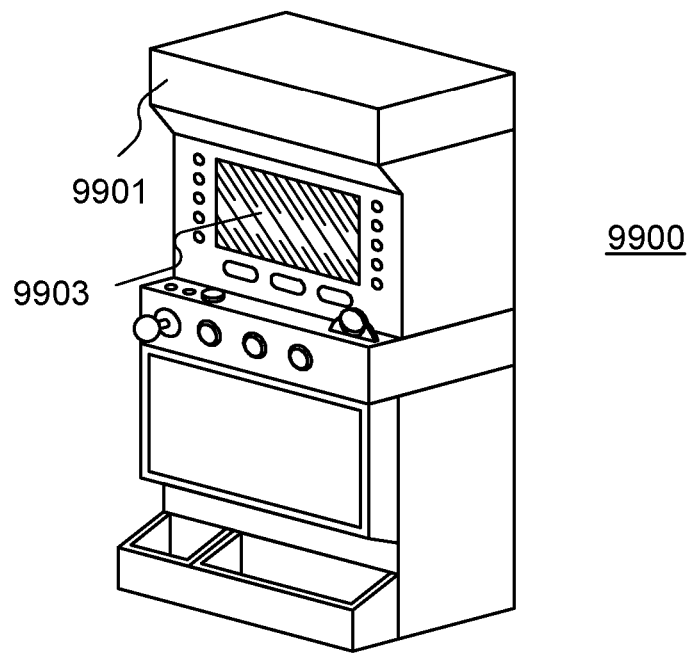

FIG. 28B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of an embodiment of the present invention may be employed. The slot machine 9900 may include other accessory equipment as appropriate.

Figure 29A:
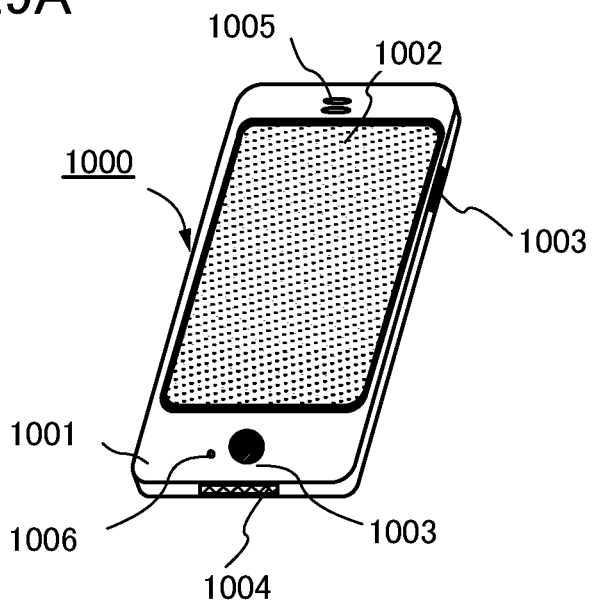
FIGS. 29A and 29B each illustrate an example of a mobile phone.

FIG. 29A illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 29A is touched with a finger or the like, data can be input into the cellular phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen mode is switched by touching the display portion 1002 or operating the operation buttons 1003 of the housing 1001. Alternatively, the screen mode may be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period while a signal is detected by the optical sensor in the display portion 1002, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 29B:
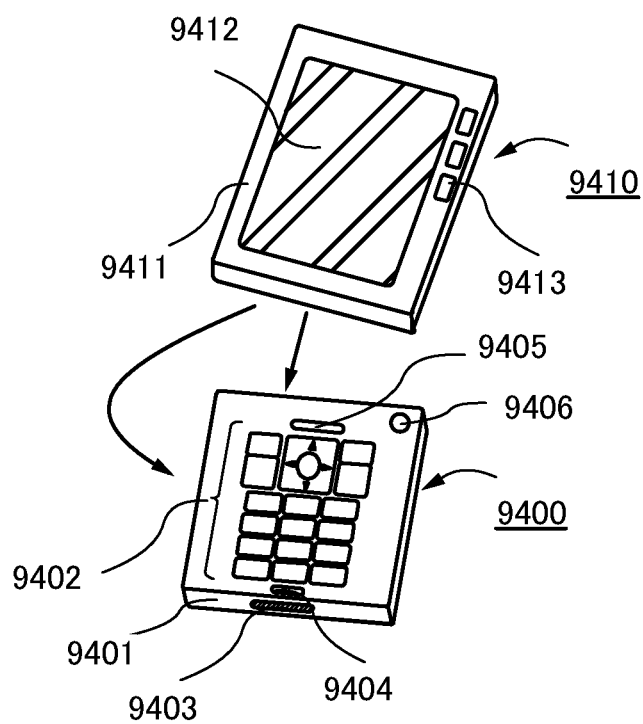

FIG. 29B illustrates another example of a cellular phone. The cellular phone in FIG. 29B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function by moving in two directions represented by the allows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

This application is based on Japanese Patent Application serial no. 2008-259031 filed with Japan Patent Office on Oct. 3, 2008, the entire contents of which are hereby incorporated by reference.

What is claimed is:

1. A display device comprising a pixel portion and a circuit,
   wherein the pixel portion comprises a first thin film transistor including a first oxide semiconductor layer,
   wherein the circuit comprises;
      a second thin film transistor including a gate electrode, a second oxide semiconductor layer, and a first insulating layer in contact with the second oxide semiconductor layer;
      a third thin film transistor including a third oxide semiconductor layer; and a wiring is provided over the second oxide semiconductor layer and the third oxide semiconductor layer, wherein the wiring is electrically connected to the second oxide semiconductor layer and the third oxide semiconductor layer, wherein the gate electrode of the second thin film transistor is provided below the second oxide semiconductor layer, wherein the gate electrode of the second thin film transistor includes a first region and a second region, wherein the first region extends beyond a first end portion of the second oxide semiconductor layer in a channel length direction of the second thin film transistor, wherein the second region extends beyond a second end portion of the second oxide semiconductor layer in the channel length direction of the second thin film transistor, wherein a length of the first region is larger than a length of the second region in the channel length direction of the second thin film transistor, wherein a gate insulating layer is provided between the wiring and the gate electrode of the second thin film transistor, and wherein the wiring is in direct contact with the first region of the gate electrode of the second thin film transistor through a contact hole formed in the gate insulating layer.

2. The display device according to claim 1, wherein the first insulating layer has an island shape.

3. The display device according to claim 1, wherein each of the first oxide semiconductor layer, the second oxide semiconductor layer and the third oxide semiconductor layer comprises indium, gallium and zinc.

4. The display device according to claim 1, wherein a fourth oxide semiconductor layer having smaller thickness and higher conductivity than the third oxide semiconductor layer is provided between the wiring and the third oxide semiconductor layer.

5. The display device according to claim 4, wherein the fourth oxide semiconductor layer comprises indium, gallium and zinc.

6. The display device according to claim 1, further comprising a second insulating layer over the first thin film transistor, the second thin film transistor, and the third thin film transistor, wherein the second insulating layer is in contact with the first insulating layer.

7. A display device comprising a pixel portion and a circuit,
wherein the pixel portion comprises a first thin film transistor including a first gate electrode, a first oxide semiconductor layer, and a first channel protective layer provided on and in contact with the first oxide semiconductor layer overlapped with the first gate electrode,
wherein the circuit comprises:
a second thin film transistor including a second gate electrode, a gate insulating layer on the second gate electrode, a second oxide semiconductor layer on the gate insulating layer, and a second channel protective layer provided on and in contact with the second oxide semiconductor layer overlapped with the second gate electrode;
a third thin film transistor including a third gate electrode, the gate insulating layer on the third gate electrode, a third oxide semiconductor layer on the gate insulating layer, and a third channel protective layer provided on and in contact with the third oxide semiconductor layer overlapped with the third gate electrode;
a first wiring provided over the second oxide semiconductor layer;
a second wiring provided over the second oxide semiconductor layer and the third oxide semiconductor layer; and
a third wiring provided over the third oxide semiconductor layer, wherein the second gate electrode is provided below the second oxide semiconductor layer, wherein the second gate electrode includes a first region and a second region, wherein the first region extends beyond a first end portion of the second oxide semiconductor layer in a channel length direction of the second thin film transistor, wherein the second region extends beyond a second end portion of the second oxide semiconductor layer in the channel length direction of the second thin film transistor, wherein a length of the first region is larger than a length of the second region in the channel length direction of the second thin film transistor, wherein the second wiring is a source wiring or a drain wiring of the third thin film transistor electrically connected to the third oxide semiconductor layer, wherein the gate insulating layer is provided between the second wiring and the second gate electrode, and wherein the second wiring is in direct contact with the first region of the second gate electrode through a contact hole formed in the gate insulating layer.

8. The display device according to claim 7, wherein each of the first channel protective layer, the second channel protective layer, and the third channel protective layer has an island shape.

9. The display device according to claim 7, wherein each of the first oxide semiconductor layer, the second oxide semiconductor layer and the third oxide semiconductor layer comprises indium, gallium and zinc.

10. The display device according to claim 7, wherein a fourth oxide semiconductor layer having smaller thickness and higher conductivity than the third oxide semiconductor layer is provided between the source wiring and the third oxide semiconductor layer or between the drain wiring and the third oxide semiconductor layer.

11. The display device according to claim 10, wherein the fourth oxide semiconductor layer comprises indium, gallium and zinc.

12. The display device according to claim 7, further comprising an insulating layer over the first thin film transistor, the second thin film transistor, and the third thin film transistor,
wherein the insulating layer is in contact with the first channel protective layer, the second channel protective layer, and the third channel protective layer.

* * * * *